(12) United States Patent
Shimbayashi

(10) Patent No.: US 8,076,753 B2
(45) Date of Patent: Dec. 13, 2011

(54) SEMICONDUCTOR DEVICE AND METHOD OF MANUFACTURING THE SAME

(75) Inventor: Koji Shimbayashi, Aichi-ken (JP)

(73) Assignee: Spansion LLC, Sunnyvale, CA (US)

( * ) Notice: Subject to any disclaimer, the term of this patent is extended or adjusted under 35 U.S.C. 154(b) by 20 days.

(21) Appl. No.: 11/479,373

(22) Filed: Jun. 30, 2006

(65) Prior Publication Data
US 2007/0013027 A1    Jan. 18, 2007

Related U.S. Application Data

(63) Continuation-in-part of application No. PCT/JP2005/012070, filed on Jun. 30, 2005.

(51) Int. Cl.
*H01L 29/00* (2006.01)

(52) U.S. Cl. .................. 257/532; 257/E29.345

(58) Field of Classification Search .................. 257/296, 257/369, 371, 374, 376, E27.067, E29.345, 257/532, E27.05, E27.06; 365/182
See application file for complete search history.

(56) References Cited

U.S. PATENT DOCUMENTS

| | | | | |
|---|---|---|---|---|
| 3,653,978 A | * | 4/1972 | Robinson et al. | 438/217 |
| 5,963,840 A | * | 10/1999 | Xia et al. | 438/783 |
| 6,111,295 A | * | 8/2000 | Arai | 257/392 |
| 6,461,921 B1 | * | 10/2002 | Arai | 438/298 |
| 7,281,214 B2 | * | 10/2007 | Fadell | 715/745 |
| 2001/0006479 A1 | * | 7/2001 | Ikehashi et al. | 365/185.24 |
| 2001/0034250 A1 | * | 10/2001 | Chadha | 455/566 |
| 2006/0215890 A1 | * | 9/2006 | Dunham | 382/128 |
| 2006/0229099 A1 | * | 10/2006 | Chen et al. | 455/556.1 |

FOREIGN PATENT DOCUMENTS

| | | |
|---|---|---|
| JP | 49040684 | 8/1947 |
| JP | 62265752 | 11/1987 |
| JP | 63308366 | 12/1988 |
| JP | 63308366 A * | 12/1988 |
| JP | 2004172633 | 6/2004 |

* cited by examiner

*Primary Examiner* — Evan Pert
*Assistant Examiner* — Selim Ahmed

(57) ABSTRACT

In the semiconductor device composing MOS transistor on which impurities are added from the surface of a P-type substrate, the region of immediate below a gate layer is the P-type substrate on which the impurities are not added, and first and second MOS devices, having an N-type diffusion layer are provided on the surface region of the P-type substrate circumscribing the gate layer. The gate layer of the first MOS device, and the N-type diffusion layer of the second MOS device are connected, and the N-type diffusion layer of the first MOS device and the gate layer of the second MOS device are connected, and thereby a first capacitive element is composed.

28 Claims, 15 Drawing Sheets

SEMICONDUCTOR DEVICE AND METHOD OF MANUFACTURING THE SAME

CROSS-REFERENCES TO RELATED APPLICATIONS

This is a continuation in part of International Application No. PCT/JP2005/012070, filed Jun. 30, 2005 which was not published in English under PCT Article 21(2).

TECHNICAL FIELD

The invention relates to a semiconductor device having capacitive elements, and a method of manufacturing the same, and more particularly to a semiconductor device having capacitive elements improved in terminal voltage dependence of capacity values, in a semiconductor device composed of MOS transistors, and a method of manufacturing the same.

BACKGROUND ART

The MOS capacitor disclosed in Patent Document 1 comprises a first MOS transistor having source terminal and drain terminal commonly, and a second MOS transistor similarly having source terminal and drain terminal commonly, and the first MOS transistor and the second MOS transistor are unified in p-channel type or n-channel type, and individual gate terminals and source-drain terminals are connected in cross multiplication.

In Patent Document 1, depletion mode MOS transistors are used as first and second MOS transistors T1, T2. Capacity curves of the first and the second MOS transistors T1, T2 are mutually interpolating opposite shapes, and a nearly flat capacity change curve is obtained when the both are added.

It is also said that a similar characteristic is obtained when enhancement mode MOS transistors are used as first and second MOS transistors.

Patent Document 1: Japanese Unexamined Patent Application Publication No. H5 (1993)-82741

DISCLOSURE OF THE INVENTION

Problems to be Solved by the Invention

However, when depletion mode MOS transistors are used as first and second MOS transistors, in order to present a depletion mode characteristic, impurities must be diffused and/or implanted in the channel region of MOS transistor. In the semiconductor device not using depletion mode MOS transistors in a circuit configuration, a step of diffusing and/or implanting impurities must be newly added in order to form depletion mode MOS transistors necessary when composing a MOS capacitor. As a result, the manufacturing process of semiconductor device is complicated.

When enhancement mode MOS transistors are used as the first and second MOS transistors, although a manufacturing process such as impurity implanting process is not required, an inversion layer is not formed on the channel region in the voltage region where a voltage less than threshold voltage of MOS transistor is applied as terminal voltage, and the capacity value is smaller than the capacity value where the inversion layer is formed. The decreasing region of capacity value occurs simultaneously in two MOS transistors connected oppositely. Accordingly, in the terminal voltage region of less than threshold voltage, a sinus is formed in the capacity characteristic, and flat capacity change curve may not be obtained.

Means for Solving the Problems

The invention is conceived in the light of the above problems of the background art, and it is hence an object thereof to present a semiconductor device composed of MOS transistors, having capacitive elements improved in terminal voltage dependence of capacity values without adding an extra manufacturing process, and a method of manufacturing the same.

In order to achieve the above object, a semiconductor device according to the present invention comprises:

a MOS transistor formed by adding impurities on a surface of a P-type substrate provided as a base, the P-type substrate including an region of immediate-below-gate-layer on which the impurities are not added; and a first MOS device and a second MOS device, each of which has an N-type diffusion region on the surface of the P-type substrate which circumscribes the gate layer, wherein the first MOS device and the second MOS device constitute a first capacitive element by connecting a gate layer and an N-type diffusion layer of the first MOS device to an N-type diffusion layer and a gate layer of the second MOS device, respectively.

In the semiconductor device of the invention, a MOS transistor is formed by adding impurities on a surface of a P-type substrate provided as a base, the P-type substrate includes a region of immediate-below-gate-layer on which the impurities are not added, and first and second MOS devices have individually an N-type diffusion region n the surface of the P-type substrate which circumscribes the gate layer. A gate layer of the first MOS device, and an N-type diffusion layer of the second MOS device are connected, and an N-type diffusion layer of the first MOS device and a gate layer of the second MOS device are connected, and thereby a first capacitive element is composed.

The first and second MOS devices constitute a MOS device using the P-type substrate as a base for forming the semiconductor device as an immediate-below-gate-layer. In the region of immediate-below-gate-layer of the first and second MOS devices of P-type substrate, impurities are not added for controlling the voltage, so-called threshold voltage, to be applied to the gate layer when forming an inversion layer induced by minority carrier.

The semiconductor device is formed on the surface of a P-type wafer. Using the P-type wafer as P-type substrate, by adding impurities on its surface, generally, an NMOS/PMOS transistor is formed. Accordingly, the impurity concentration of a P-type well is kept low, and when forming an NMOS transistor, the P-type impurity is additionally applied to the channel region, and the concentration is raised, and the P-type channel region is formed. When forming a PMOS transistor, the N-type impurity is additionally applied to the channel region, and the concentration is raised, and the N-type channel region is formed.

By contrast, in the first and second MOS devices constituting a MOS structure using the P-type substrate as channel region, minority carrier induced as the inversion layer are electrons, and N-type characteristic is shown. In addition, since the P-type impurity concentration in the region of immediate-below-gate-layer is low, the threshold voltage for forming an inversion layer is nearly 0 V, and N-type MOS characteristic of depletion type or close to depletion type is presented. Without doing dedicated impurities addition, a MOS device having depletion characteristic can be composed.

As a result, the capacity characteristic in the first and second MOS devices has a nearly constant capacity value because an inversion layer is formed in the region of immediate-below-gate-layer of P-type substrate while the gate layer voltage of an N-type diffusion layer is in positive bias voltage state from the threshold voltage of nearly 0 V.

In each one of the first and second MOS devices, by connecting the gate layer and the N-type diffusion layer as a pair, the first capacitive element connected in parallel has a characteristic not lowering so much in capacity value at bias voltage near 0 V.

Herein, the first and second MOS devices are devices for composing the first capacitive element, and are devices having terminals of the gate layer and the N-type diffusion layer functioning as capacitive elements. Therefore, the first and second MOS devices may be formed in MOS transistor structure having a pair of N-type diffusion layers in each device, but MOS transistor structure is not always required. Various shapes may be considered, such as the N-type diffusion layer circumscribing part of peripheral edge of the gate layer, or circumscribing to surround the gate layer. The number of N-type diffusion layers of circumscribing is not limited, as far as all N-type diffusion layers are electrically connected in each device.

Furthermore, according to the present invention, a manufacturing method of a semiconductor device comprising a MOS transistor on a surface of a P-type substrate provided as a base, the manufacturing method comprises the steps of:

selectively implanting impurities on the surface of the P-type substrate;

forming a gate layer on a channel region where the impurities have been implanted and on the P-type substrate where the impurities are not implanted; and implanting an N-type impurities for forming an N-type diffusion layer masked with the gate layer formed on the channel region and on the P-type substrate.

In the manufacturing method of a semiconductor device of the invention, after selectively implanting impurities on a surface of a P-type substrate provided as a base, a gate layer is formed by way of a gate oxide film on each one of the channel region on which impurities are implanted, and the P-type substrate on which impurities are not implanted, an N-type impurity for forming an N-type diffusion layer is implanted by using the gate layer formed on the channel region as mask, and an N-type impurity for forming an N-type diffusion layer is implanted by using the gate layer formed on the P-type substrate as mask.

Accordingly, when manufacturing a semiconductor device on a P-type substrate, by forming a gate layer by way of gate oxide film after implanting impurities selectively on the surface of the P-type substrate, a MOS transistor is formed in which the impurity concentration of channel region is adjusted and an inversion layer is induced at a preferable threshold voltage, and by forming a gate layer also on the P-type substrate on which impurities are not added by way of gate oxide film, a MOS type device is formed. In this MOS type device, the region of immediate-below-gate-layer is a P-type substrate, and since the impurity concentration is formed low, the inversion layer is induced at a threshold voltage near 0 V. Not requiring additional manufacturing process for implanting impurities, a MOS device of depletion type or characteristic close to depletion type is formed.

Effects of the Invention

According to the invention, without adding any dedicated impurities, or without requiring additional manufacturing process for implanting impurities, a MOS device is formed in which an inversion layer is formed in the region of immediate-below-gate-layer at bias voltage of nearly 0 V, and therefore it presents a semiconductor device capable of forming capacitive elements having characteristic hardly lowered in capacity values across the bias voltage of 0 V, and a manufacturing method of such semiconductor device.

BEST MODE FOR CARRYING OUT THE INVENTION

First and second embodiments of a semiconductor device and its manufacturing method of the invention are specifically described below while referring to FIG. 1A to FIG. 12.

Figure 1A:
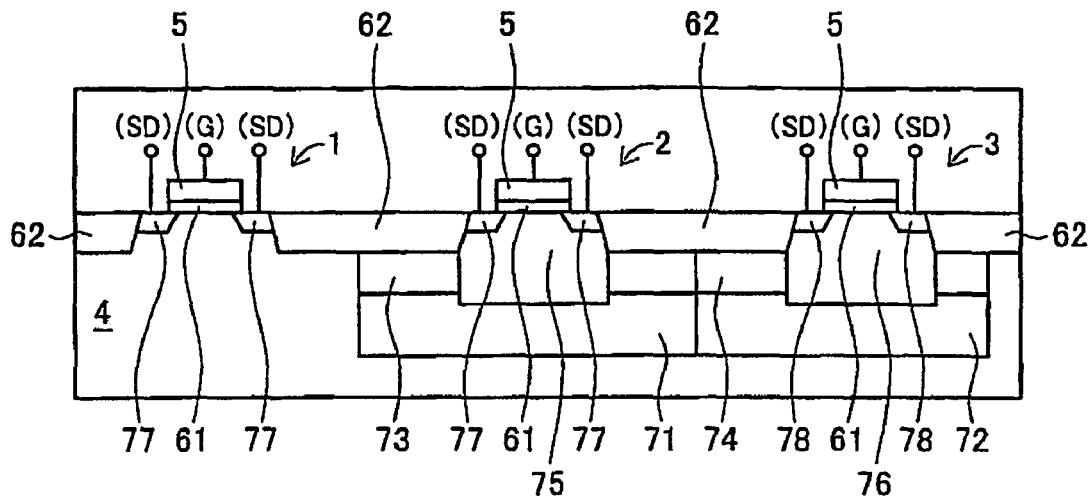
FIG. 1A is a sectional view of a structure of a semiconductor device of the invention.

FIG. 1A is a sectional view of a structure of a semiconductor device in first and second embodiments of the invention. This semiconductor device has a P-type substrate 4 as a base, and includes a MOS device 1, a NMOS transistor 2, and a PMOS transistor 3. These devices are enclosed by a STI layer 62 formed of SiO2, and the devices are electrically isolated.

Figure 1B:
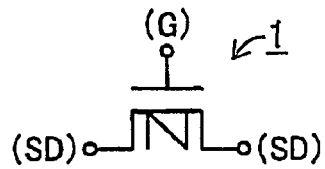
FIG. 1B is a partial circuit diagram showing a symbol of a MOS device.
Figure 1C:
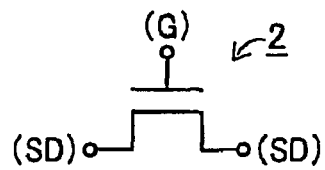
FIG. 1C is a partial circuit diagram showing a symbol of a NMOS transistor.
Figure 1D:
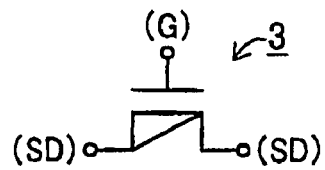
FIG. 1D is a partial circuit diagram showing a symbol of a PMOS transistor.

FIG. 1B to FIG. 1D show symbols of the MOS device 1, the NMOS transistor 2, and the PMOS transistor 3 used in the circuit diagram of the specification herein.

The MOS device 1 (of which symbol is shown in FIG. 1B) has an N-type MOS structure, in which a P-type substrate 4 is a back gate, a gate layer 5 formed on the P-type substrate 4 by polysilicon through a gate oxide film 61 is a gate, and a pair of N-type diffusion layers 77 formed on the surface region of the P-type substrate 4 and circumscribing by way of the gate layer 5 are source and drain.

The NMOS transistor 2 (of which symbol is shown in FIG. 1C) has an N-type MOS structure, in which a P-type well layer 71 is a back gate, a gate layer 5 formed on the P-type well layer 71 through a gate oxide film 61 is a gate, and a pair of the N-type diffusion layers 77 formed on the surface region of the P-type well layer 71 and circumscribing by way of the gate layer 5 are source and drain.

The P-type well layer 71 includes a first P-type well layer 75 positioned immediately below the gate layer 5 of the NMOS transistor 2, and a second P-type well layer 73 positioned below the STI layer 62. The first P-type well layer 75 is a region in which impurities are added for controlling a voltage to be applied to the gate layer, so-called threshold voltage, when generating an inversion layer induced by minority carrier of the NMOS transistor 2. The second P-type well layer 73 is a region in which impurities of high concentration is added, so-called channel stop region, for separating the NMOS transistor 2 from other devices.

The PMOS transistor 3 (of which symbol is shown in FIG. 1D) has a P-type MOS structure, in which an N-type well layer 72 is a back gate, a gate layer 5 formed on the N-type well layer 72 through a gate oxide film 61 is a gate, and a pair of a P-type diffusion layers 78 formed on the surface region of the N-type well layer 72 and circumscribing by way of the gate layer 5 are source and drain.

The N-type well layer 72 includes a first N-type well layer 76 positioned immediately below the gate layer 5 of the PMOS transistor 3, and a second N-type well layer 74 positioned below the STI layer 62. The first N-type well layer 76 is a region in which impurities are added for controlling the threshold voltage of the PMOS transistor 3. The second N-type well layer 74 is a channel stop region in which impurities are added for separating the PMOS transistor 3 from other devices.

In the MOS device 1, in the region of immediate-below-gate-layer of the MOS device 1 as the P-type substrate 4, impurities are not added for controlling a voltage to be applied to the gate layer, so-called threshold voltage, when generating an inversion layer induced by minority carrier. Accordingly, as compared with the NMOS transistor 2, the P-type impurity concentration in the region of immediate-below-gate-layer is low. Therefore, in the MOS device 1, as compared with the NMOS transistor 2, the threshold voltage for forming the inversion layer is shifted to the lower voltage side, and an N-type MOS characteristic of depletion type or close to depletion type is presented.

In the semiconductor device of the invention, the MOS device 1 is located at a position sufficiently remote from the other devices, and the voltage level of the wiring passing on the MOS device 1 is managed so as not to have effects on carrier distribution below the STI layer 62. In the MOS device 1, therefore, devices are isolated appropriately without disposing channel stop region.

First Embodiment

A first capacitive element 11 in a first embodiment is described below by referring to FIG. 2 and FIG. 3.

Figure 2:
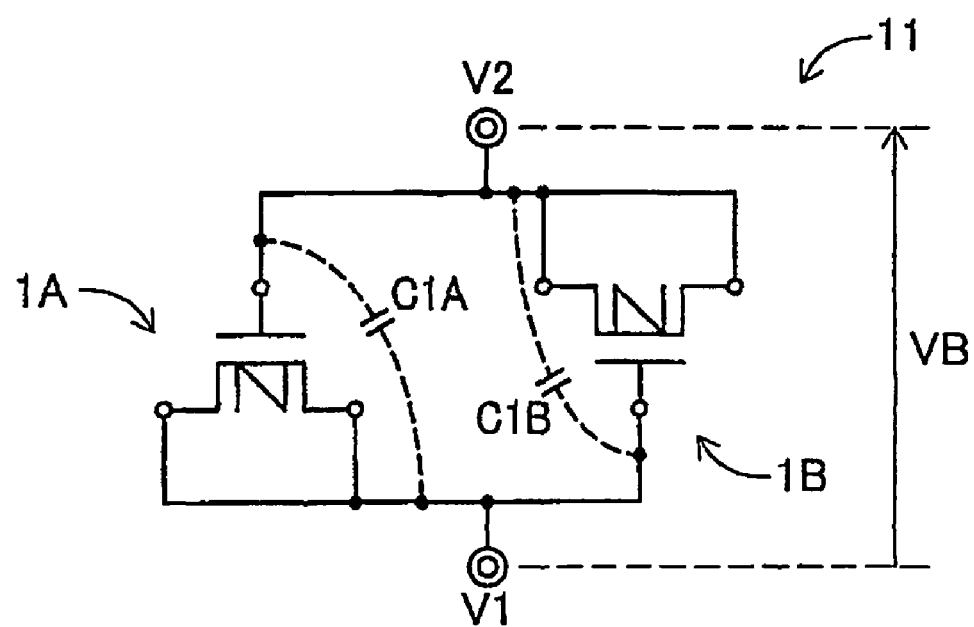
FIG. 2 is a circuit diagram of a capacitive element in a first embodiment.

FIG. 2 is a circuit diagram showing connection of the first capacitive element 11. The first capacitive element 11 has a first terminal V1 and a second terminal V2, and is composed of a first MOS device 1A and a second MOS device 1B. The first MOS device 1A and the second MOS device 1B are substantially equivalent in transistor size.

In the first capacitive element 11, the gate of the first MOS device 1A, and the source and drain of the second MOS device 1B are connected to the second terminal V2, and the source and drain of the first MOS device 1A, and the gate of the second MOS device 1B are connected to the first terminal V1. The regions of immediate-below-gate-layer of the first MOS device 1A and the second MOS device 1B are connected to the grounding potential.

In the first capacitive element 11, the capacity composed by way of the gate oxide film is utilized between the gate and the inversion layer formed immediately below the gate oxide film, in the first MOS device 1A and the second MOS device 1B. Supposing the respective capacity values to be a capacity C1A and C1B, when the bias voltage VB applied to the gate is changed in the first MOS device 1A and the second MOS device 1B, the carrier distribution varies in the region immediately below the gate oxide film, that is, in the region of immediate-below-gate-layer, and hence the capacity C1A and the capacity C1B are also changed. The characteristic of capacity values of the first MOS device 1A, the second MOS device 1B, and the first capacity element 11 is explained below.

Figure 3A:
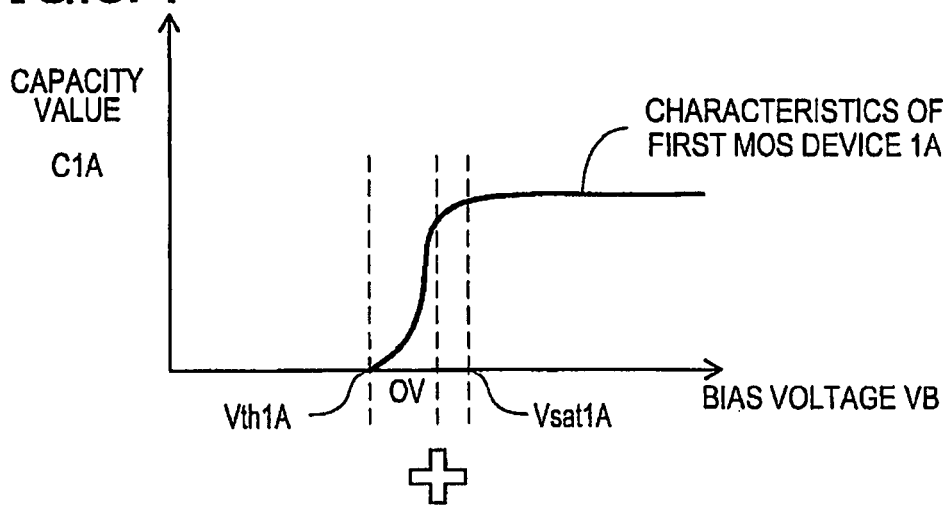
FIG. 3A is a graph showing a capacity characteristic of capacitive element in FIG. 2.
Figure 3B:
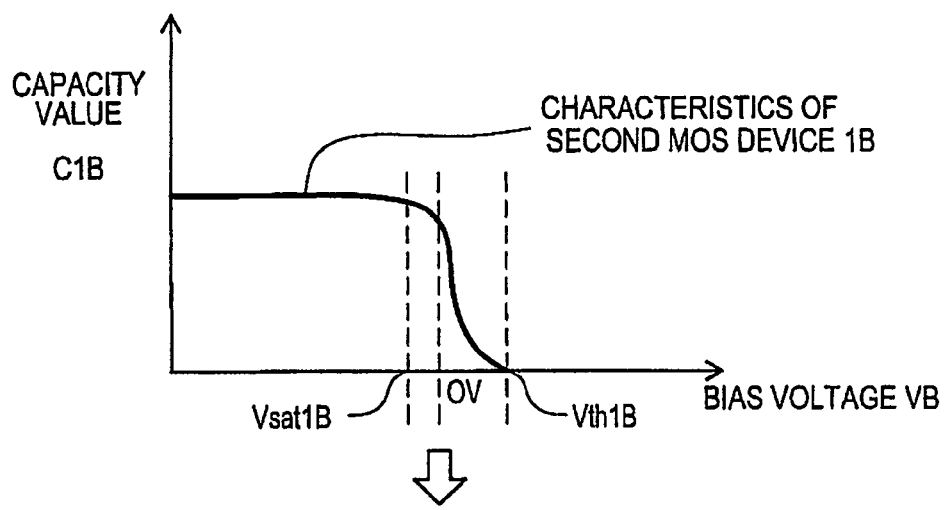
FIG. 3B is a graph showing a capacity characteristic of capacitive element in FIG. 2.
Figure 3C:
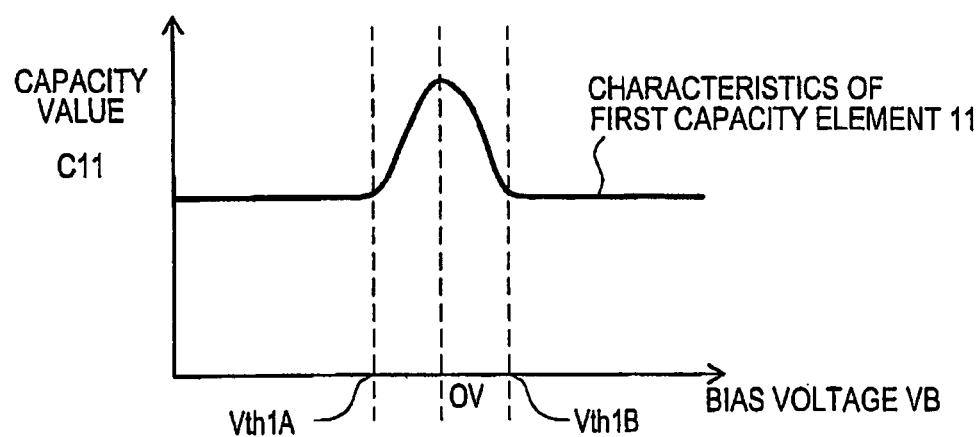
FIG. 3C is a graph showing a capacity characteristic of capacitive element in FIG. 2.

FIGS. 3A-3C are graphs showing a characteristic of capacity C1A, C1B and C11 in relation to the bias voltage VB. The bias voltage VB is a voltage to be applied to the second terminal V2 and the first terminal V1.

FIG. 3A shows the characteristic of the capacity C1A of the first MOS device 1A in relation to the bias voltage VB. As mentioned above, the first MOS device 1A has an N-type MOS characteristic close to a depletion type, and the threshold voltage Vth1A is at lower voltage side than 0 V. In the first MOS device 1A, supposing the starting voltage for forming an inversion layer to be the threshold voltage Vth1A, in the region where the bias voltage VB is lower than the threshold voltage Vth1A, an inversion layer is not formed immediately below the gate oxide film, and hence the capacity C1A is the minimum value. When the bias voltage VB exceeds the threshold voltage Vth1A, the region of the inversion layer increases along with the elevation of the bias voltage VB, and hence the capacity C1A also rises. Supposing the voltage for forming the inversion layer completely to be a saturation voltage Vsat1A, in the region where the bias voltage VB is higher than this saturation voltage Vsat1A, the capacity C1A becomes the nearly constant maximum capacity value.

FIG. 3B shows the characteristic of the capacity C1B of the second MOS device 1B in relation to the bias voltage VB. The second MOS device 1B is different from the first MOS device 1A only in that bias voltage VB of an inverted polarity is applied. Therefore, the graph of characteristic about the bias voltage VB is inverted right and left from the central point of the bias voltage VB=0 V. That is, in the region where the bias voltage VB is lower than the saturation voltage Vsat1B, the capacity 1B becomes the nearly constant maximum capacity value, and in the region where the bias voltage VB is somewhere from the saturation voltage Vsat1B to the threshold voltage Vth1B, the capacity C1B decreases along with elevation of the bias voltage VB. In the region where the bias voltage VB is higher than the threshold voltage Vth1B, the capacity C1B becomes the minimum value.

FIG. 3C shows the characteristic of the capacity C11 of the first capacitive element 11 in relation to the bias voltage VB. As known from FIG. 2, the capacity value of the capacity C11 is the sum of the capacity C1A and the capacity C1B. Since the first MOS device 1A and the second MOS device 1B are substantially equivalent in transistor size, the maximum value and minimum value of the capacity C1A and the capacity C1B are nearly the same values, and the characteristic graph about the bias voltage VB is laterally symmetrical about the central point of the bias voltage VB=0 V. That is, in the region where the bias voltage VB is lower than the threshold voltage Vth1A, and in the region where the bias voltage VB is higher than the threshold voltage Vth1B, the capacity C11 becomes the nearly constant maximum capacity value. On the other hand, in the region where the bias voltage VB is somewhere from the threshold voltage Vth1A to the threshold voltage Vth1B, the characteristic curve is swollen upward from the central point of the bias voltage VB=0 V.

COMPARATIVE EXAMPLE 1

Figure 4:
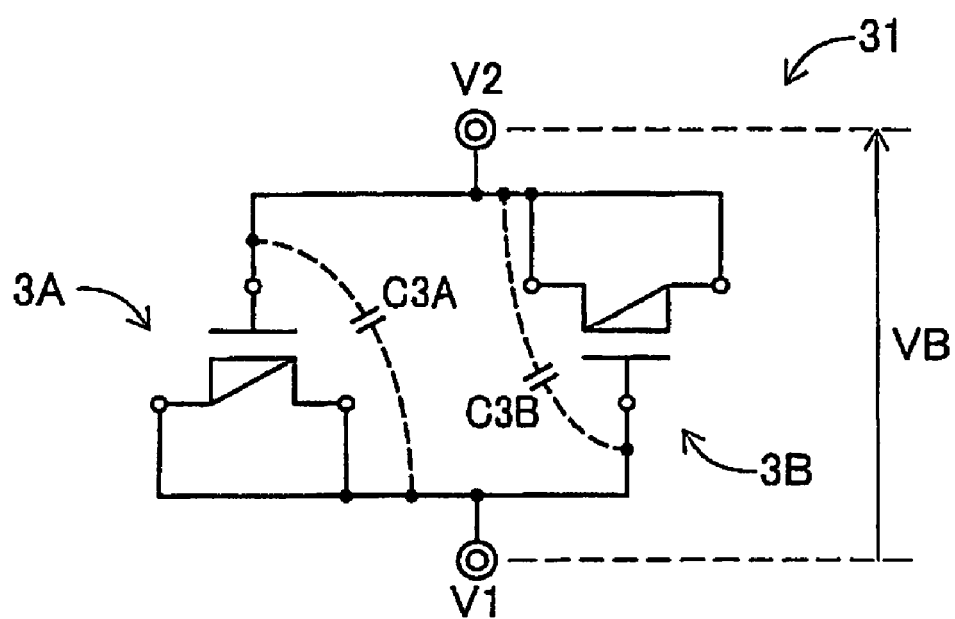
FIG. 4 is a circuit diagram of capacitive elements in a first comparative example and a second embodiment.

To compare the capacity characteristic about the first capacitive element 11, a second capacitive element 31 in comparative example 1 is explained by referring to FIG. 4 and FIG. 5.

FIG. 4 is a circuit diagram showing a connection of the second capacitive element 31. The second capacitive element 31 has a first terminal V1 and a second terminal V2, and is composed of a first PMOS transistor 3A and a second PMOS transistor 3B. The first PMOS transistor 3A and the second PMOS transistor 3B have enhancement type characteristic, and are substantially equivalent in transistor size.

In the second capacitive element 31, the gate of the first PMOS transistor 3A, and the source and drain of the second PMOS transistor 3B are connected to the second terminal V2, and the source and drain of the first PMOS transistor 3A, and the gate of the second PMOS transistor 3B are connected to the first terminal V1. Though not shown in the diagram, the back gates of the first PMOS transistor 3A and the second PMOS transistor 3B are connected to the grounding potential.

In the second capacitive element 31, same as in the first capacitive element 11, the capacity composed by way of the gate oxide film is utilized between the gate and the inversion layer formed immediately below the gate oxide film, in the first PMOS transistor 3A and the second PMOS transistor 3B. Supposing the respective capacity values to be the capacity C3A and C3B, when the bias voltage VB applied to the gate is changed in the first PMOS transistor 3A and second PMOS transistor 3B, the carrier distribution varies in the region of immediate-below-gate-layer, and hence the respective capacity values C3A and C3B are also changed depending on the bias voltage VB.

Figure 5A:
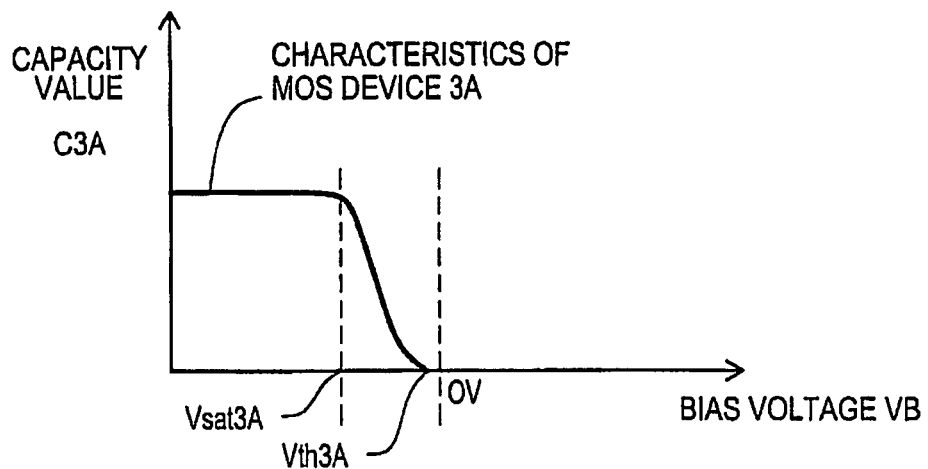
FIG. 5A is a graph showing capacity characteristic of capacitive elements in FIG. 4.
Figure 5B:
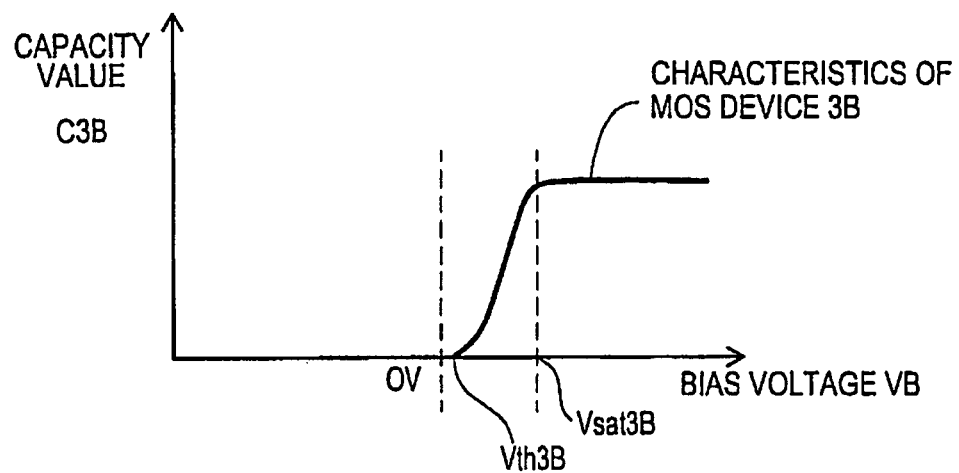
FIG. 5B is a graph showing capacity characteristic of capacitive elements in FIG. 4.
Figure 5C:
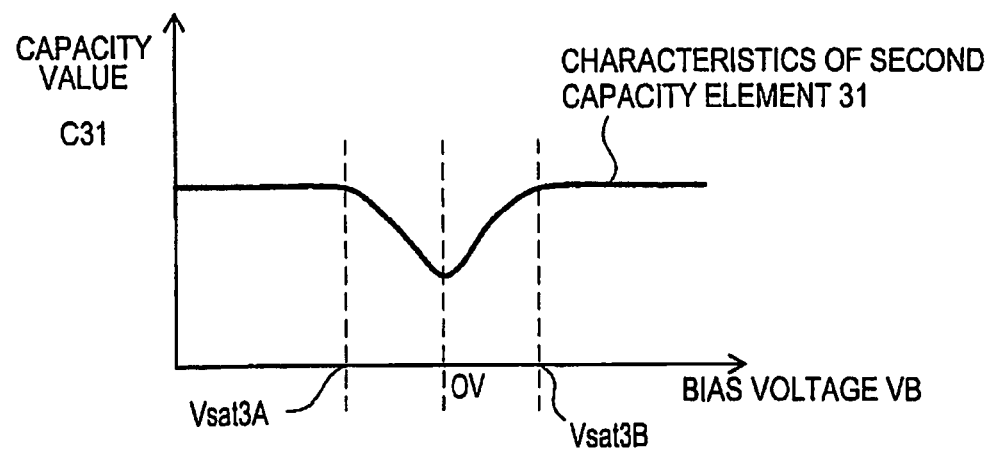
FIG. 5C is a graph showing capacity characteristic of capacitive elements in FIG. 4.

FIGS. 5A-5C are graphs showing a capacity characteristic of the capacity values C3A, C3B and C31 in relation to the bias voltage VB. The bias voltage VB is a voltage to be applied to the second terminal V2 and the first terminal V1.

FIG. 5A shows the characteristic of the capacity C3A of the first PMOS transistor 3A in relation to the bias voltage VB. In the first PMOS transistor 3A having P type MOS characteristic of an enhancement type, in the region where the bias voltage VB is lower than a saturation voltage Vsat3A, an inversion layer is formed immediately below the gate oxide film, and the capacity C31 becomes the nearly constant maximum capacity value. In the region where the bias voltage VB is somewhere from the saturation voltage Vsat3A to the threshold voltage Vth3A, the region of the inversion layer decreases along with elevation of the bias voltage VB, and hence the capacity C3A also decreases. In the region where the bias voltage VB is higher than the threshold voltage Vth3A, the region of the inversion layer is extinguished, and the capacity C3A becomes the minimum capacity value. The saturation voltage Vsat3A is the voltage at which the inversion layer is formed completely in the first PMOS transistor 3A.

FIG. 5B shows the characteristic of the capacity C3B of the second PMOS transistor 3B in relation to the bias voltage VB. The second PMOS transistor 3B is different from the first PMOS transistor 3A only in that the bias voltage VB of the inverted polarity is applied. Therefore, the graph of characteristic about the bias voltage VB is inverted right and left from the central point of the bias voltage VB=0 V as shown in FIG. 5B.

FIG. 5C shows the characteristic of the capacity C31 of the second capacitive element 31 in relation to the bias voltage VB. As known from FIG. 4, the capacity value of the capacity C31 is the sum of the capacity C3A and the capacity C3B. Since the first PMOS transistor 3A and the second PMOS transistor 3B are substantially equivalent in transistor size, the maximum value and minimum value of the capacity C3A and the capacity C3B are nearly the same values, and the characteristic graph about the bias voltage VB is laterally symmetrical about the central point of the bias voltage VB=0 V. That is, in the region where the bias voltage VB is lower than the threshold voltage Vth3A, and in the region where the bias voltage VB is higher than the threshold voltage Vth3B, the capacity C31 becomes the nearly constant maximum capacity value. On the other hand, in the region where the bias voltage VB is somewhere from the threshold voltage Vth3A to the threshold voltage Vth3B, both the capacity C3A and the capacity C3B are below 50% of the maximum capacity value in a point of the bias voltage VB=0 V. Thus, the characteristic curve is dented downward from the central point of the bias voltage VB=0 V.

COMPARATIVE EXAMPLE 2

Figure 6:
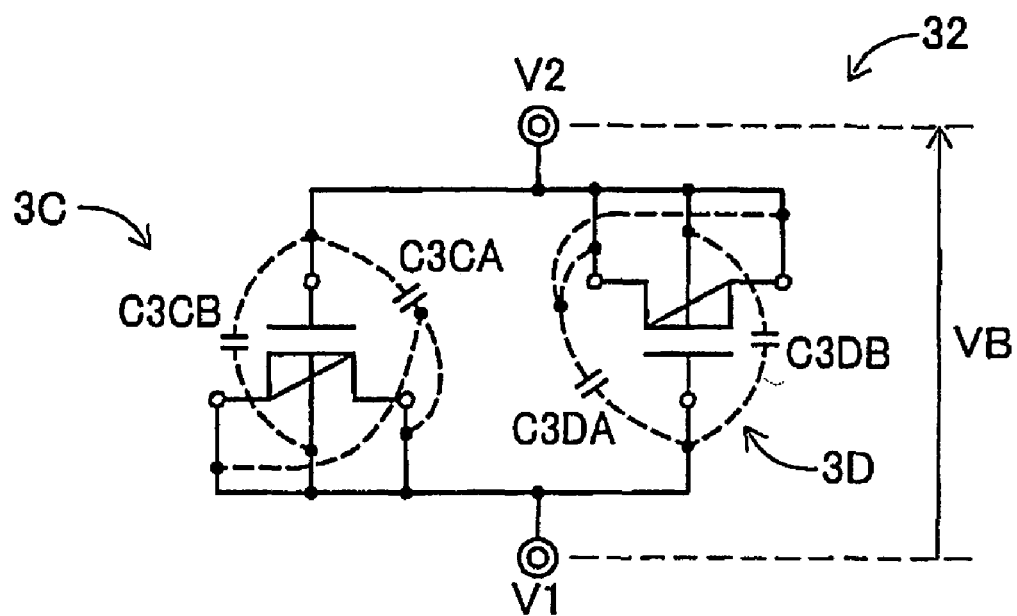
FIG. 6 is a circuit diagram of capacitive elements in a second comparative example and a third embodiment.

To compare the capacity characteristic about the first capacitive element 11, a third capacitive element 32 in the comparative example 2 is explained by referring to FIG. 6 and FIG. 7.

FIG. 6 is a circuit diagram showing a connection of the third capacitive element 32. The third capacitive element 32 has a first terminal V1 and a second terminal V2, and is composed of a third PMOS transistor 3C and a fourth PMOS transistor 3D. The third PMOS transistor 3C and the fourth PMOS transistor 3D have an enhancement type characteristic, and are substantially equivalent in transistor size.

In the third capacitive element 32, the gate of the third PMOS transistor 3C, and the source, the drain, and the back gate not shown of the fourth PMOS transistor 3D are connected to the second terminal V2, and the source, the drain, and the back gate not shown of the third PMOS transistor 3C, and the gate of the fourth PMOS transistor 3D are connected to the first terminal V1.

In the third capacitive element 32, the capacities C3CA, C3DA composed by way of the gate oxide film are utilized between the gate and the inversion layer formed immediately below the gate oxide film, and the capacities C3CB, C3DB composed by way of the gate oxide film are utilized between the gate and the back gate immediately below the gate oxide film, in the third PMOS transistor 3C and the fourth PMOS transistor 3D. The capacity value of the capacity C3C of the third PMOS transistor 3C is the sum of the capacity C3CA and the capacity C3CB, and the capacity value of the capacity C3D of the fourth PMOS transistor 3D is the sum of the capacity C3DA and the capacity C3DB. In the third PMOS transistor 3C and the fourth PMOS transistor 3D, when the bias voltage VB applied to the gate is changed, the carrier distribution varies in the region of immediate-below-gate-layer, and hence the capacity values C3C and C3C are also changed depending on the bias voltage VB.

Figure 7A:
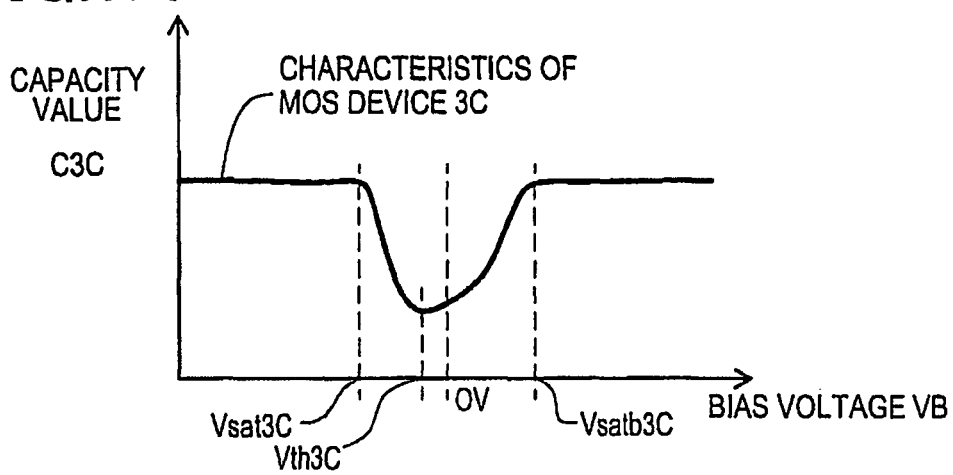
FIG. 7A is a graph showing a capacity characteristic of capacitive elements in FIG. 6.
Figure 7B:
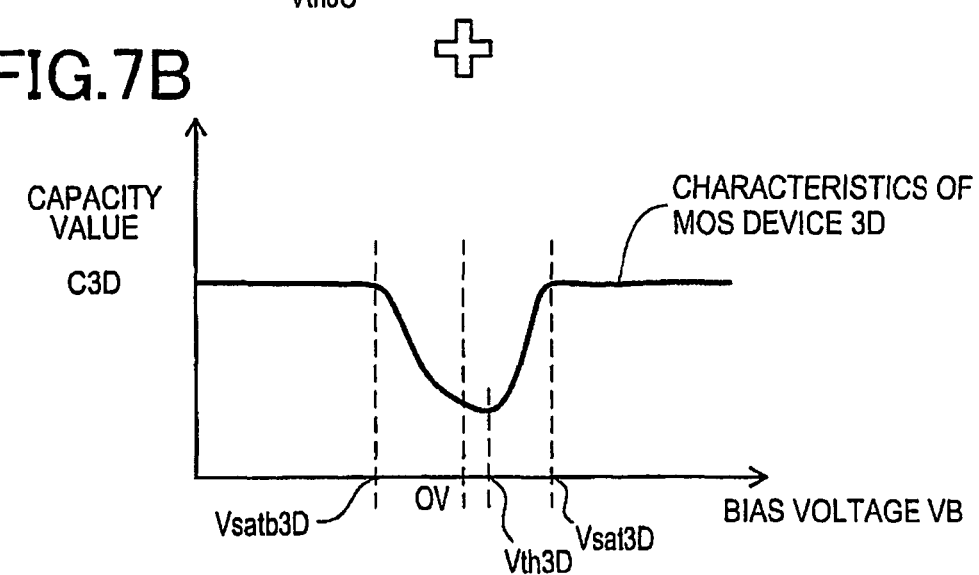
FIG. 7B is a graph showing a capacity characteristic of capacitive elements in FIG. 6.
Figure 7C:
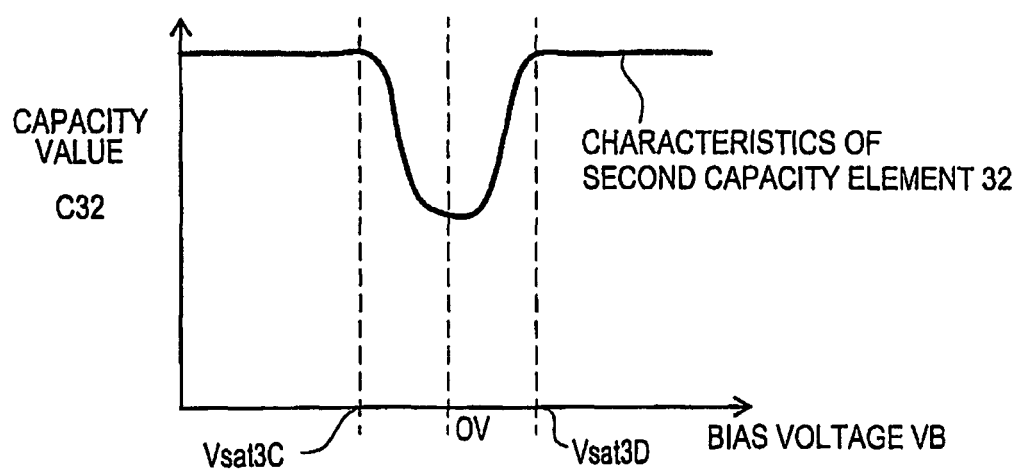
FIG. 7C is a graph showing a capacity characteristic of capacitive elements in FIG. 6.

FIGS. 7A-7C are graphs showing a capacity characteristic of the capacities C3C, C3D and the capacity value C31 in relation to the bias voltage VB. The bias voltage VB is a voltage to be applied to the second terminal V2 and the first terminal v1.

FIG. 7A shows the characteristic of the capacity C3C of the third PMOS transistor 3C in relation to the bias voltage VB. In the third PMOS transistor 3C showing an enhancement type P-type MOS characteristic, in the region where the bias voltage VB is lower than a saturation voltage Vsat3C, an inversion layer is formed immediately below the gate oxide film, and the capacity C3CA composed between the gate and the inversion layer immediately below the gate oxide film becomes the nearly constant maximum capacity value. In the region where the bias voltage VB is somewhere from the saturation voltage Vsat3C to the threshold voltage Vth3C, the region of the inversion layer decreases along with elevation of the bias voltage VB, and hence the capacity C3CA also decreases. In the region where the bias voltage VB is near the threshold voltage Vth3C, a depletion layer is formed immediately below the gate oxide film, and the capacity C3CA becomes the minimum capacity value. However, in the region from the threshold voltage Vth3C till a back gate saturation voltage Vsat3C, the region of an N-type diffusion layer immediately below the gate oxide film increases along with elevation of the bias voltage VB. As a result, the capacity value of the capacity C3CB composed between the gate and an accumulation layer immediately below the gate oxide film is increased. In the region where the bias voltage VB is higher than the back gate saturation voltage Vsatb3C, the depletion layer is extinguished, and the capacity C3CB becomes the nearly constant maximum value by the capacity composed between the gate and the accumulation layer immediately below the gate oxide film.

Therefore the capacity value of the capacity C3C, which is the sum of capacity values of the capacity C3CA, and the capacity C3CB shows the characteristic as shown in FIG. 7A.

The saturation voltage Vsat3C is the voltage at which the inversion layer is formed completely in the third PMOS transistor 3C, and the back gate saturation voltage Vsatb3C is the voltage at which the N-type diffusion layer is formed completely.

FIG. 7B shows the characteristic of the capacity C3D of the fourth PMOS transistor 3D in relation to the bias voltage VB. The fourth PMOS transistor 3D is different from the third PMOS transistor 3C only in that the bias voltage VB of inverted polarity is applied. Therefore, the graph of characteristic about the bias voltage VB is inverted right and left from the central point of the bias voltage VB=0 V as shown in FIG. 7B.

FIG. 7C shows the characteristic of the capacity C32 as the sum of the capacity C3C and the capacity C3D in the third capacitive element 32 in relation to the bias voltage VB. Since a third PMOS transistor 3C and a fourth PMOS transistor 3D are substantially equivalent in transistor size, the maximum value and the minimum value of the capacity C3C and capacity C3D are nearly the same values, and the characteristic graph about the bias voltage VB is laterally symmetrical about the central point of the bias voltage VB=0 V. That is, in the region where the bias voltage VB is lower than the threshold voltage Vth3C, and in the region where the bias voltage VB is higher than the threshold voltage Vth3D, the capacity C32 becomes the nearly constant capacity value. On the other hand, in the region where the bias voltage VB is somewhere from the threshold voltage Vth3C to the threshold voltage Vth3D, the characteristic curve is dented downward from the central point of the bias voltage VB=0 V.

In the third capacitive element 32, since the capacity between the accumulation layer immediately below the gate oxide film and the gate is also utilized, the capacity value per transistor size is larger than in the second capacitive element 31 in comparative example 1.

In the first capacitive element 11 of the first embodiment, as compared with the comparative example 1 and the comparative example 2, a characteristic with less drop of capacity value at the bias voltage near 0 V is obtained.

In the first embodiment, the characteristic of capacity value in the first capacitive element 11 is swollen upward. However, the characteristic of capacity value varies depending on the P-type impurity concentration contained in the P-type substrate 4. For example, when the P-type impurity concentration becomes higher, the threshold voltage is raised, and the upward swelling of the characteristic of the capacity value is suppressed. Thus, by using an appropriate P-type electrode obtaining the characteristic suppressing the upward swelling, a flat characteristic of the capacity value may be obtained, for example, by the first capacitive element 11 alone.

Second Embodiment

Figure 8:
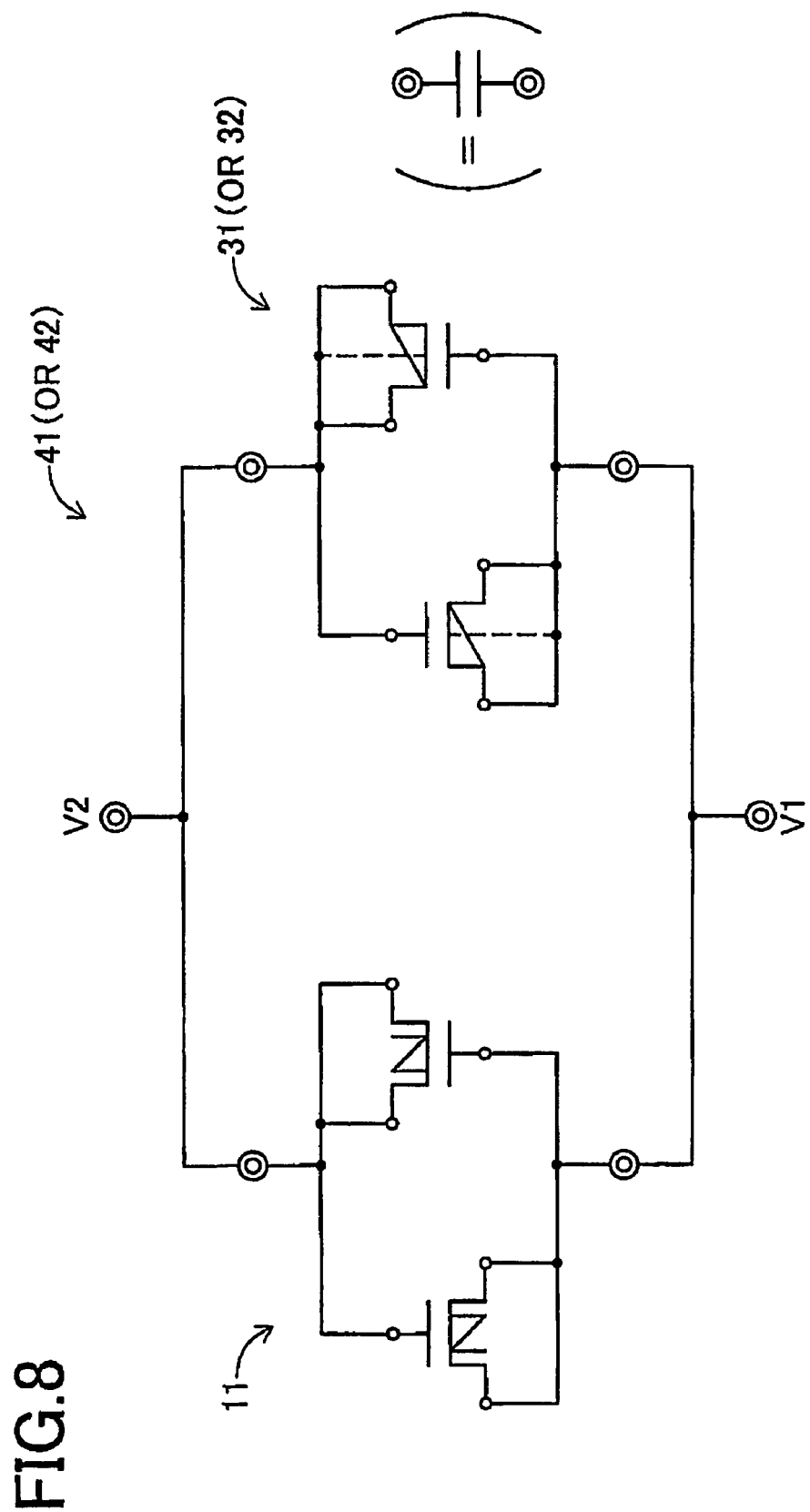
FIG. 8 is a circuit diagram of composite capacitive elements in the second embodiment and the third embodiment.

A composite capacitive element 41 in a second embodiment is described below by referring to FIG. 8. The composite capacitive element 41 has a first terminal V1 and a second terminal V2, and includes the first capacitive element 11 of the first embodiment, and a second capacitive element 31 of the comparative example 1. Specifically, the first terminal V1 of the first capacitive element 11 and the first terminal V1 of the second capacitive element 31 are connected to constitute the first terminal V1 of the composite capacitive element 41, and the second terminal V2 of the first capacitive element 11 and the second terminal V2 of the second capacitive element 31 are connected to constitute the second terminal V2 of the composite capacitive element 41.

Therefore, the capacity value of the capacity C41 of the composite capacitive element 41 is the sum of the capacity value of the capacity C11 of the first capacitive element 11 and the capacity value of the capacity C31 of the second capacitive element 31. Accordingly, in the characteristic of the capacity C41 about the bias voltage VB, near the bias voltage VB=0 V, upward swelling in the characteristic (see FIG. 3C) of the first capacitive element 11 and downward denting in the characteristic (see FIG. 3C) of the second capacitive element 31 cancel with each other. Further, by adjusting the transistor size of the first capacitive element 11 and/or the second capacitive element 31, a flat characteristic of the capacity value may be also obtained.

Third Embodiment

A composite capacitive element 42 in a third embodiment is described below.

The composite capacitive element 42 has a third capacitive element 32 of the comparative example 2, instead of the second capacitive element 31 of the composite capacitive element 41 in the second embodiment. That is, the composite capacitive element 42 has a first terminal V1 and a second terminal V2, and includes the first capacitive element 11 of the first embodiment and the third capacitive element 32 of comparative example 2. As in the case of the second embodiment, the first terminal V1 of the first capacitive element 11 and the first terminal V1 of the third capacitive element 32 are connected to constitute the first terminal V1 of the composite capacitive element 41, and the second terminal V2 of the first capacitive element 11 and the second terminal V2 of the third capacitive element 32 are connected to constitute the second terminal V2 of the composite capacitive element 41.

Therefore, as in the case of the second embodiment, the capacity value of the capacity C42 of the composite capacitive element 42 is the sum of the capacity value of the capacity C11 of the first capacitive element 11 and the capacity value of the capacity C32 of the third capacitive element 32. Accordingly, in the characteristic of the capacity C41 about the bias voltage VB, near the bias voltage VB=0 V, upward swelling in the characteristic (see FIG. 3C) of the first capacitive element 11 and downward denting in the characteristic (see FIG. 7C) of the second capacitive element 31 cancel with each other. Further, by adjusting the transistor size of the first capacitive element 11 and/or the composite capacitive element 42, a flat characteristic of the capacity value may be also obtained.

Incidentally, the third capacitive element 32 also makes use of the capacity between the gate and the back gate as mentioned above, the capacity value per transistor size is about twice as much as compared with the second capacitive element 31. Accordingly, in the composite capacitive element 42, when obtaining the same capacity value as that of the composite capacitive element 41, a third capacitive element 32 of half transistor size as compared with the second capacitive element 31 is enough, and hence the size is more compact that the composite capacitive element 41.

Figure 9:
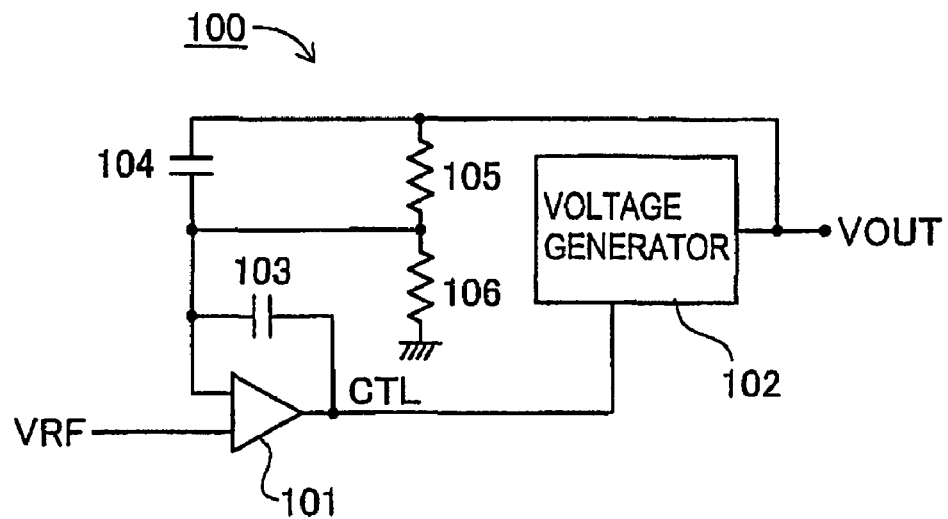
FIG. 9 is a circuit diagram of a program power source as an example of use of a capacitive element.
Figure 10A:
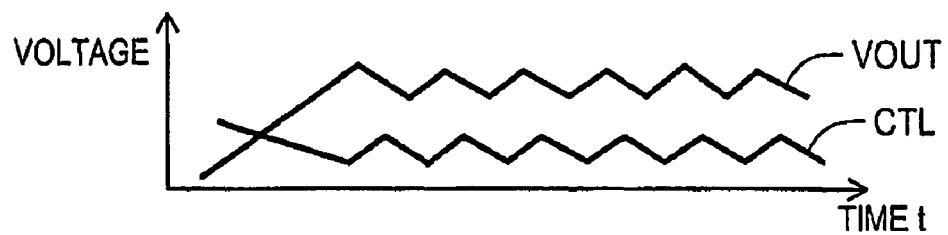
FIG. 10A is a waveform diagram showing an output characteristic in FIG. 9.
Figure 10A:
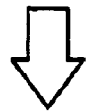
Figure 10B:
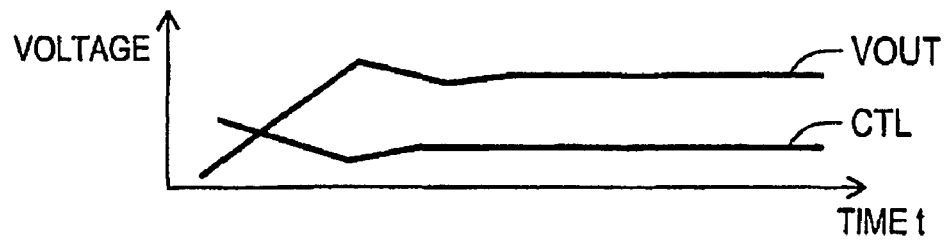
FIG. 10B is a waveform diagram showing an output characteristic in FIG. 9.

The use of first capacitive element 31 in the first embodiment in a program power source 100 is explained by referring to FIG. 9 and FIGS. 10A and 10B.

A known program power source 100 which produces a constant output voltage VOUT depending on a reference voltage VRF includes an operational amplifier 101, a voltage generator 102 for generating a voltage depending on changes of a control output CTL of the operational amplifier 101, a capacitive element 103 for compensating the phase for the operational amplifier 101, a capacitive element 104, and a resistive elements 105, 106 for dividing the output voltage VOUT and generating an internal voltage VDIV.

In this program power source 100, when the output voltage VOUT fluctuates, the internal voltage VDIV divided and produced by the resistive elements 105, 106 is changed. The operational amplifier 101 detects this change of the internal voltage VDIV, and issues the control output CTL. As a result, the voltage generator 102 issues an output voltage VOUT depending on the control output CTL. At this time, the potential difference at both ends of the capacitive element 103 varies in a range centered on 0 V.

As such capacitive element 103, for example, when the second capacitive element 31 in comparative example 1 is used, it changes near the voltage at both ends of the second capacitive element 31, that is, the bias voltage VB=0 V in the second capacitive element 31, and hence the capacity value is small. The capacity value necessary for phase compensation is small, and the potential of the control output CTL is unstable. As a result, as shown in FIG. 1A, the output voltage VOUT and the control output CTL may possibly oscillate.

By contrast, when the first capacitive element 11 in the first embodiment is used as the capacitive element 103, as compared with the case of using the second capacitive element 31, the capacity value near the bias voltage=0 V does not become small, and the potential of the control output CTL is much stabler as shown in FIG. 10B.

Further, when the composite capacitive element 41 in the second embodiment or the composite capacitive element 42 in the third embodiment is used as the capacitive element 103, the capacity value near the bias voltage=0 V hardly becomes small, and a stable output voltage VOUT can be similarly produced.

Figure 11A:
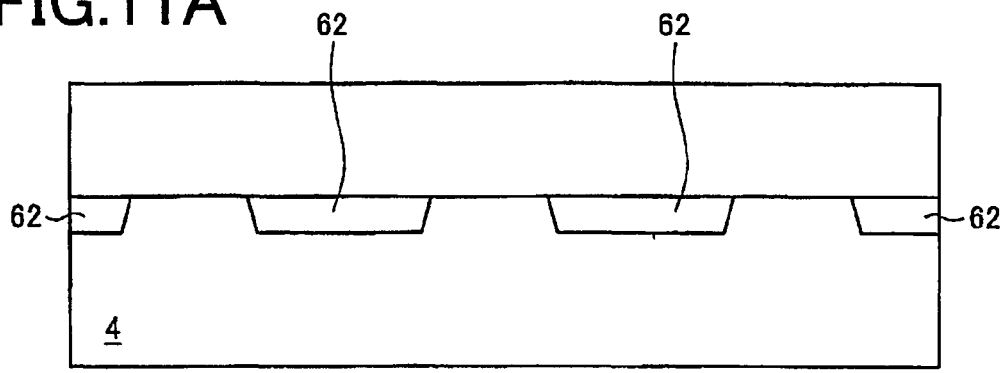
FIGS. 11A, 11B and 11C are sectional views showing the process up to forming of a gate layer in the manufacturing method of semiconductor device of the invention.
Figure 11B:
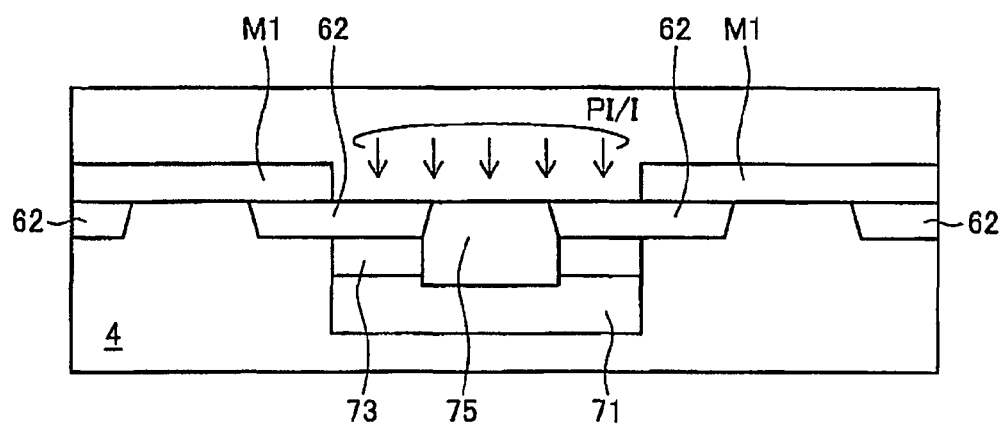
Figure 11C:
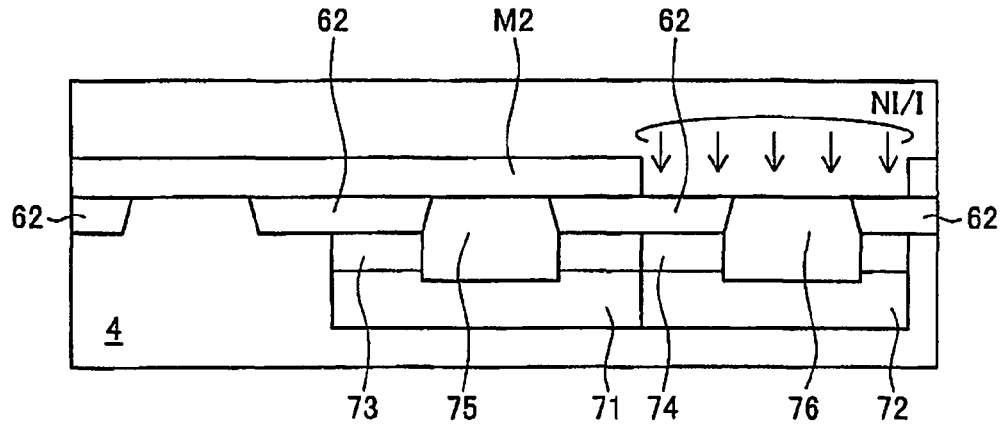

Concerning the invention, a manufacturing method of a semiconductor device comprising the MOS device 1, the NMOS transistor 2 and the PMOS transistor 3 is explained below by referring to FIGS. 11A-11C and FIG. 12. FIGS. 11A-11C show the process before forming of a gate electrode, and FIG. 12 shows the process after forming of the gate electrode.

FIG. 11A shows a state of an STI layer 62 formed on the P-type substrate 4 by a known method.

The P-type substrate 4 as a base of the semiconductor device of the invention has a characteristic of resistivity of 2 to 50 ohm-cm. Specifically, for example, 12 MP0P of Shin-Etsu Chemical Industries may be used.

Successively, as shown in FIG. 11B, a resist mask M1 is formed for exposing the region of the NMOS transistor 2, and a P-type impurity ions are implanted. At this time, a P-type well layer 71 is formed by ion implantation in the condition of high acceleration energy, a second P-type well layer 73 is formed by ion implantation in the condition of medium acceleration energy, and a first P-type well layer 75 is formed by ion implantation in the condition of low acceleration energy. The P-type impurity of ion implantation includes phosphorus P+ and arsenic As+. After the completion of ion implantation, the resist mask M1 is removed.

In this process, the impurities are selectively implanted on the surface of the P-type substrate 4 by ion injection. Specifically, ions are injected in the diffusion region where the NMOS transistor 2 is formed, and ions are not injected in the diffusion region where the MOS device 1 is formed.

Next, as shown in FIG. 11C, a resist mask M2 is formed for exposing the region of the PMOS transistor 3, and an N-type impurity ions are implanted. At this time, an N-type well layer 72 is formed by ion implantation in the condition of high acceleration energy, a second N-type well layer 74 is formed by ion implantation in the condition of medium acceleration energy, and a first N-type well layer 76 is formed by ion implantation in the condition of low acceleration energy. The N-type impurity of ion implantation includes boron B—. After ion implantation, the resist mask M2 is removed.

In this process, too, the impurities are selectively implanted on the surface of the P-type substrate 4, and ions are not injected in the diffusion region where the MOS device 1 is formed.

Figure 12D:
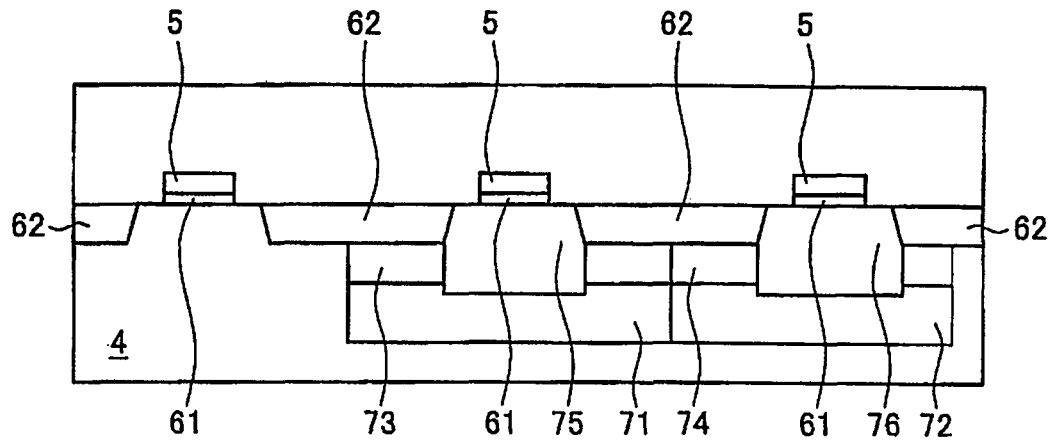
FIGS. 12D, 12E and 12F are sectional views showing the process after forming of a gate layer in the manufacturing method of the semiconductor device of the invention.

On the whole surface, consequently, oxide film and polysilicon are formed, and further as shown in FIG. 12D, a gate layer 5 and the gate oxide film 61 are formed by a known technology of photolithography.

In this process, on the region of the NMOS transistor 2 and the PMOS transistor 3 by ion implantation, and on the P-type substrate 4 forming the MOS device 1 without implantation, the gate layer 5 is formed by way of the gate oxide film 61.

Figure 12E:
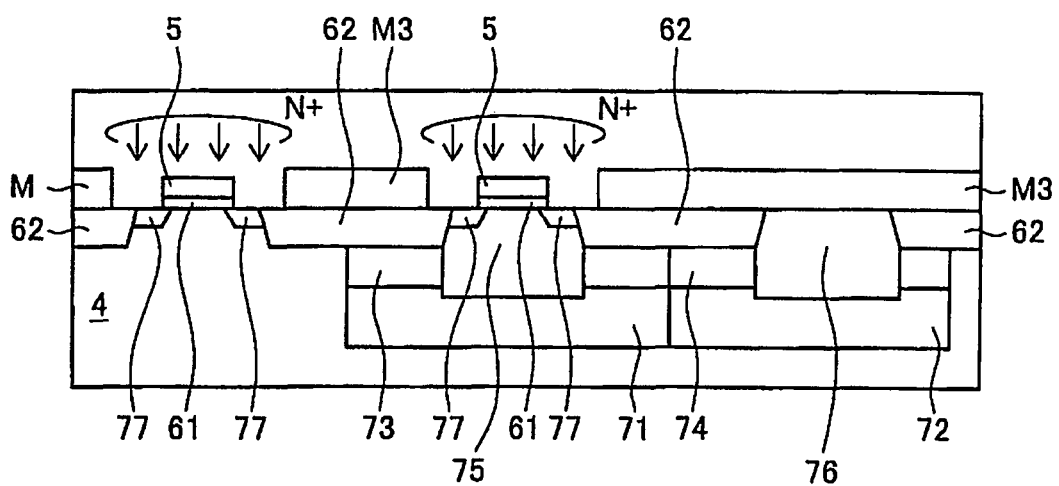

As shown in FIG. 12E, a resist mask M3 for exposing the diffusion region of the MOS device 1 and the NMOS transistor 2 is formed, and the N-type impurity ions are injected. At this time, ions are injected in the condition of low acceleration energy, and an N-type diffusion region 77 forming each source and drain region is formed. Then, the resist mask M3 is removed.

In this process, in the region of the MOS device 1 and the NMOS transistor 2, the N-type impurity ions are implanted to form the N-type diffusion layer 77 by using the formed gate layer 5 and the resist mask M3 as a mask.

Figure 12F:
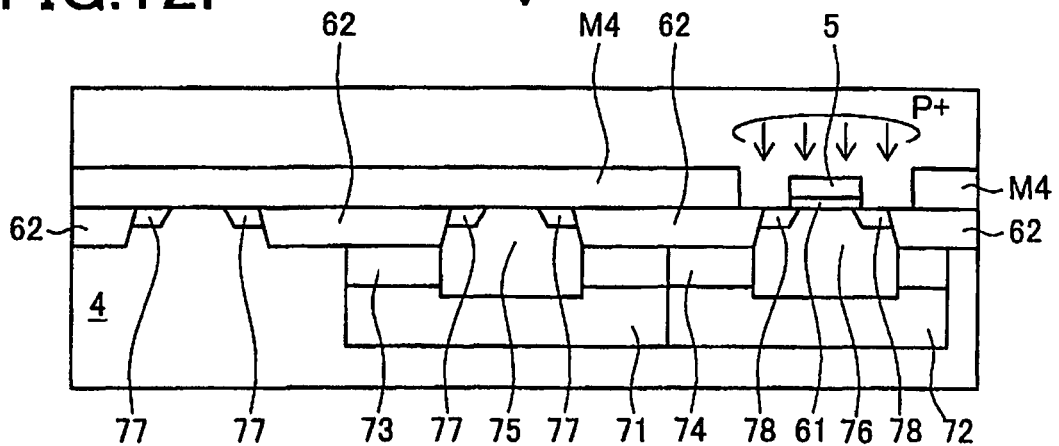

Successively, as shown in FIG. 12F, forming a resist mask M4 exposing the diffusion region of the PMOS transistor 3, the P-type impurity ions are implanted. At this time, ions are injected in the condition of low acceleration energy, and a P-type diffusion layer 78 forming each source and drain region is formed.

In this process, in the region of the PMOS transistor 3, the P-type impurity ions are implanted to form the P-type diffusion layer 78 by using the formed gate layer 5 and the resist mask M4 as a mask.

Then the resist mask M4 is removed, and further by a known method, a contact hole and wiring are formed in the source, drain and the gate of each transistor, and thereby a semiconductor device is completed.

In the manufacturing method of the semiconductor device of the invention, the impurities are selectively implanted on the surface of the P-type substrate (FIG. 11B, FIG. 11C), and the gate layer 5 is formed by way of the gate oxide layer 61 (FIG. 12D). As a result, the impurity concentration of the channel region is adjusted, and the inversion layer is induced at a favorable threshold voltage, and the MOS device 1 having such NMOS transistor 2 and P-type substrate as region of immediate-below-gate-layer is formed. In this MOS transistor 1, since the impurity concentration in the region of immediate-below-gate-layer is low, it is characteristic that the inversion layer is induced at the threshold voltage near 0 V. The manufacturing method of the semiconductor device of the invention is not accompanied by addition of a step of impurity implantation, and the MOS device 1 having characteristic of depletion type or close to depletion type can be formed.

The invention is not limited to the illustrated embodiments alone, but may be changed and modified in various forms without departing from the scope of the true spirit thereof.

For example, in the second embodiment, in the second capacitive element 31, the back gate is connected to the grounding potential, but the back gate may be connected to other potential than the grounding potential.

In the embodiments, the MOS device has a pair of N-type diffusion layers and has a MOS transistor structure, but the invention is not limited to the MOS transistor substrate. That is, the N-type diffusion layer may be designed in various forms, for example, circumscribing part of peripheral edge of the gate layer, circumscribing to surround the gate layer, etc. The number of N-type diffusion layers of circumscribing is not limited, as far as all N-type diffusion layers are connected electrically in each device.

It should be appreciated that the embodiments of the present claimed subject matter generally relates to semiconductor devices. More particularly, embodiments allow semiconductor devices to function with increased efficiency. In one implementation, the claimed subject matter is applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

Figure 13:
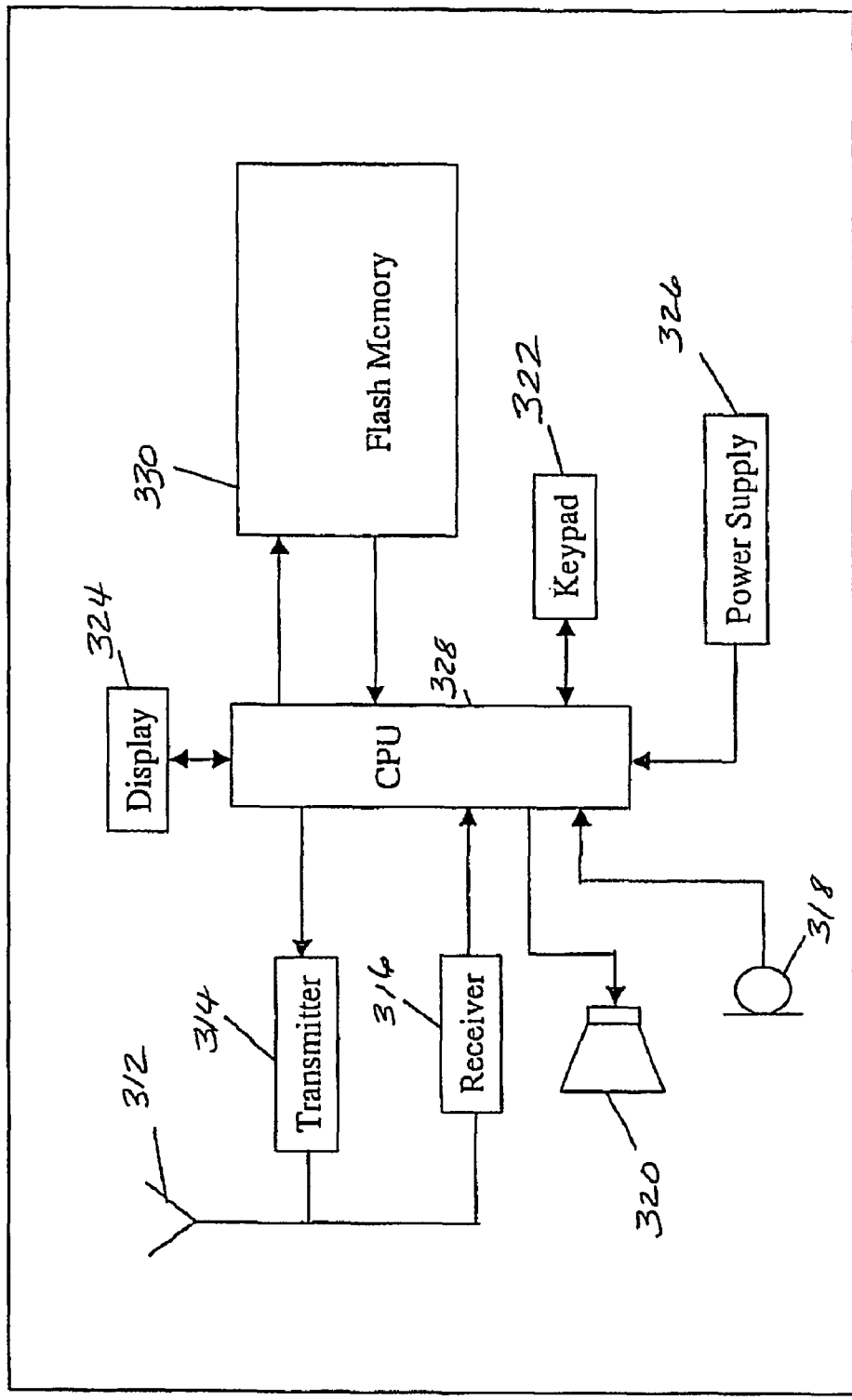
FIG. 13 shows a block diagram of a conventional portable telephone (a.k.a. cell phone, cellular phone, mobile phone, internet protocol phone, wireless phone, etc.), upon which embodiments can be implemented according to one embodiment of the present invention.

FIG. 13 shows a block diagram of a conventional portable telephone 310 (a.k.a. cell phone, cellular phone, mobile phone, internet protocol phone, wireless phone, etc.), upon which embodiments can be implemented. The cell phone 310 includes an antenna 312 coupled to a transmitter 314 a receiver 316, as well as, a microphone 318, speaker 320, keypad 322, and display 324. The cell phone 310 also includes a power supply 326 and a central processing unit (CPU) 328, which may be an embedded controller, conventional microprocessor, or the like. In addition, the cell phone 310 includes integrated, non-volatile memory 330.

In one embodiment, non-volatile memory 330 includes a MOS transistor formed by adding impurities on a surface of a P-type substrate provided as a base. The P-type substrate includes a region of immediate-below-gate-layer on which the impurities are not added. Non-volatile memory 330 further includes a first MOS device and a second MOS device, each of which has an N-type diffusion region on the surface of the P-type substrate which circumscribes the gate layer. In one embodiment, the first MOS device and the second MOS device constitute a first capacitive element by connecting a gate layer and an N-type diffusion layer of the first MOS device to an N-type diffusion layer and a gate layer of the second MOS device, respectively.

Figure 14:
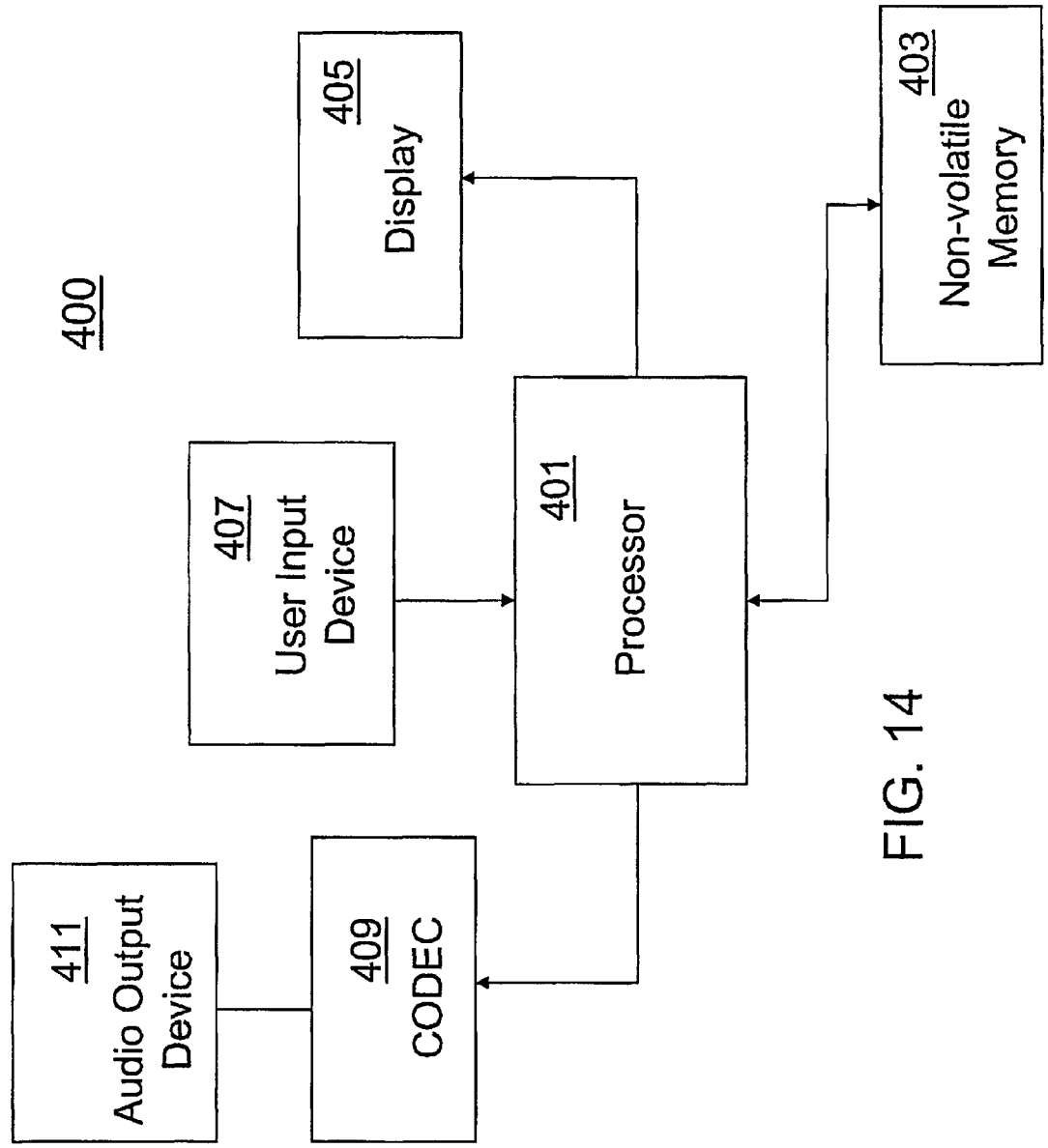
FIG. 14 shows a media player that uses a non-volatile memory device according to one embodiment of the present invention.

FIG. 14 shows a media player 400 that uses a non-volatile memory device according to one embodiment of the present invention. In the FIG. 14 embodiment, media player 400 includes processor 401, non-volatile memory 403, display 405, user input 407, codec 409 and audio output 411.

In operation, processor 401 executes playback of media files and controls the operation of media player 400. In one embodiment, user inputs made via user input 407 can be used to trigger file playback, file record, stop file playback, playback volume control, etc. Non-volatile memory 403 stores media files that may be stored for playback. In one embodiment, both audio and video files may be stored for playback. CODEC 409 produces an analog output signal that is supplied to audio output 411. In one embodiment, the playback of audio files can be facilitated via audio output 411 which can include but is not limited to speakers and headphones. In one embodiment, the playback of video files can be facilitated by a display 405 screen.

In one embodiment, non-volatile memory 403 includes a MOS transistor formed by adding impurities on a surface of a P-type substrate provided as a base. The P-type substrate includes a region of immediate-below-gate-layer on which the impurities are not added. Non-volatile memory 403 further includes a first MOS device and a second MOS device, each of which has an N-type diffusion region on the surface of the P-type substrate which circumscribes the gate layer. In one embodiment, the first MOS device and the second MOS device constitute a first capacitive element by connecting a gate layer and an N-type diffusion layer of the first MOS device to an N-type diffusion layer and a gate layer of the second MOS device, respectively.

Figure 15:
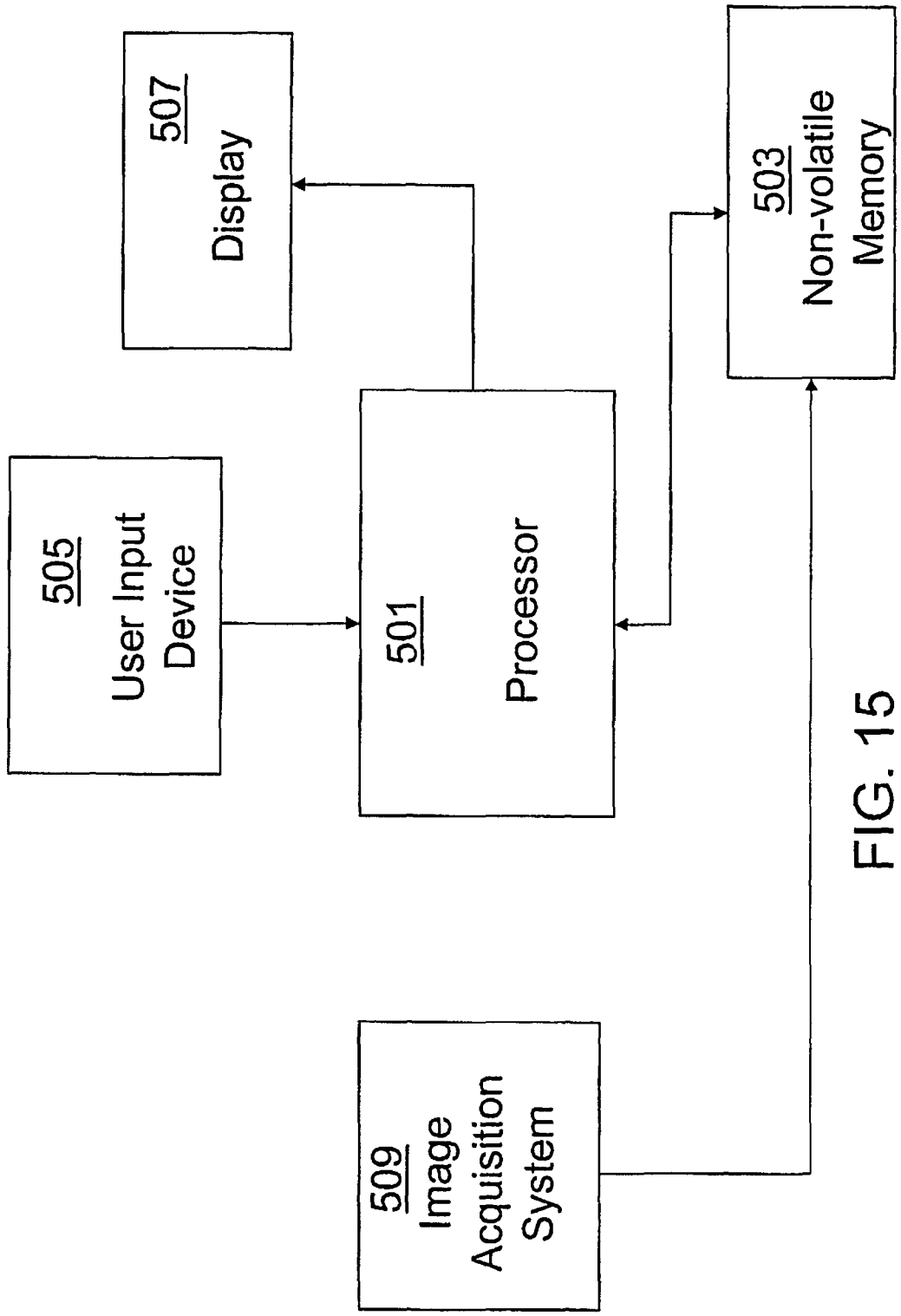
FIG. 15 shows a camera that uses a non-volatile memory device as is described in detail herein according to one embodiment of the present invention.

FIG. 15 shows a camera 500 that uses a non-volatile memory device as is described in detail herein according to one embodiment of the present invention. In the FIG. 15 embodiment, camera 500 includes processor 501, non-volatile memory 503, user input 505, display screen 507 and image acquisition system 509.

In operation, processor 501 controls the operation of camera 500 including the processing of image data acquired by image acquisition system 509. In one embodiment, user inputs made via user input 505 can be used to trigger image acquisition, storage, processing, display, etc. Non-volatile memory 503 stores image files that may be stored for uploading or display purposes. In one embodiment, images may be presented on display screen 507.

In one embodiment, non-volatile memory 503 can include a flash memory device that includes a MOS transistor formed by adding impurities on a surface of a P-type substrate provided as a base. The P-type substrate includes a region of immediate-below-gate-layer on which the impurities are not added. Flash memory 503 further includes a first MOS device and a second MOS device, each of which has an N-type diffusion region on the surface of the P-type substrate which circumscribes the gate layer. In one embodiment, the first MOS device and the second MOS device constitute a first capacitive element by connecting a gate layer and an N-type diffusion layer of the first MOS device to an N-type diffusion layer and a gate layer of the second MOS device, respectively.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 16:
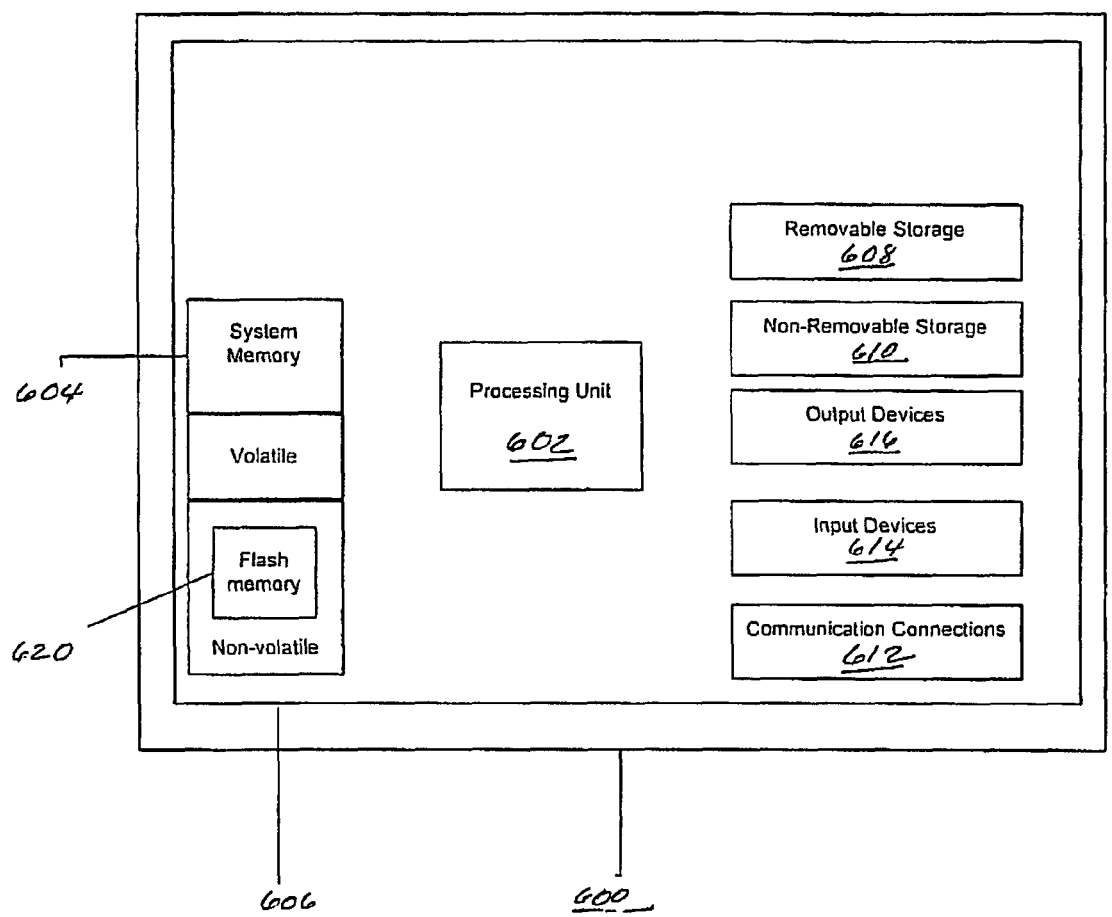
FIG. 16 illustrates a block diagram of a computing device, upon which embodiments of the present claimed subject matter can be implemented according to one embodiment of the present invention.

FIG. 16 illustrates a block diagram of a computing device 600, upon which embodiments of the present claimed subject matter can be implemented. Although computing device 600 is shown and described in FIG. 16 as having certain numbers and types of elements, the embodiments are not necessarily limited to the exemplary implementation. That is, computing device 600 can include elements other than those shown, and can include more than one of the elements that are shown. For example, computing device 600 can include a greater number of processing units than the one (processing unit 602) shown. Similarly, in another example, computing device 600 can include additional components not shown in FIG. 16.

Also, it is important to note that the computing device 600 can be a variety of things. For example, computing device 600 can be but are not limited to a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounters frequent physical impacts. Also, flash memory is more able than other types of memory to withstand intense physical pressure and/or heat. And thus, portable computing devices are able to be used in a greater range of environmental variables.

In its most basic configuration, computing device 600 typically includes at least one processing unit 602 and memory 604. Depending on the exact configuration and type of computing device, memory 604 may be volatile (such as RAM), non-volatile (such as ROM, flash memory, etc.) or some combination of the two. This most basic configuration of computing device 600 is illustrated in FIG. 16 by line 606. Additionally, device 600 may also have additional features/functionality. For example, device 600 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Video Disc (DVD) recorder, the removable storage is a DVD receiving component utilized to receive and read DVDs. Such additional storage is illustrated in FIG. 16 by removable storage 608 and non-removable storage 610. Computer storage media includes volatile and nonvolatile, removable and non-removable media implemented in any method or technology for storage of information such as computer readable instructions, data structures, program modules or other data. Memory 604, removable storage 608 and non-removable storage 610 are all examples of computer storage media. Computer storage media includes, but is not limited to, RAM, ROM, EEPROM, flash memory 620 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 600. Any such computer storage media may be part of device 600. Further, in one embodiment, the flash memory 620 utilizes mirrorbit technology to allow storing of two physically distinct bits on opposite sides of a memory cell.

In the one embodiment, the aforementioned non-volatile memory can include a MOS transistor formed by adding impurities on a surface of a P-type substrate provided as a base. The P-type substrate includes a region of immediate-below-gate-layer on which the impurities are not added. The non-volatile memory can further include a first MOS device and a second MOS device, each of which has an N-type diffusion region on the surface of the P-type substrate which circumscribes the gate layer. In one embodiment, the first MOS device and the second MOS device constitute a first capacitive element by connecting a gate layer and an N-type diffusion layer of the first MOS device to an N-type diffusion layer and a gate layer of the second MOS device, respectively.

Device 600 may also contain communications connection(s) 612 that allow the device to communicate with other devices. Communications connection(s) 612 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 600 may also have input device(s) 614 such as keyboard, mouse, pen, voice input device, game input device (e.g., a joy stick, a game control pad, and/or other types of game input device), touch input device, etc. Output device(s) 616 such as a display (e.g., a computer monitor and/or a projection system), speakers, printer, network peripherals, etc., may also be included. All these devices are well known in the art and need not be discussed at length here.

What is claimed is:

1. A semiconductor device comprising:
    a first MOS device comprising impurities that are formed on a surface of a P-type substrate provided as a base, the P-type substrate including a region located beneath the gate of the first MOS device that is free of added impurities for controlling a threshold voltage wherein the first MOS device has a characteristic that is similar to that of a depletion mode MOS device;
    a second MOS device comprising impurities that are formed on a surface of the P-type substrate provided as a base wherein the impurities that are formed on the surface of the P-type substrate form a well layer that is formed immediately below the gate layer of the second MOS device, wherein the P-type substrate includes a region located beneath the gate of the second MOS device that is free of added impurities in addition to the impurities formed on the surface of the p-type substrate for controlling a threshold voltage wherein the second MOS device has a characteristic that is similar to that of a depletion mode MOS device; and
    a third MOS device that is isolated from the first MOS device and the second MOS device by a channel stop region comprising a well layer that is formed below an STI region that has a top surface that is coplanar with said substrate and that extends into second and third well layers wherein the entire channel stop region lies between the second MOS device and the third MOS device,
    wherein the first MOS device and the second MOS device, each have an N-type diffusion region on the surface of the P-type substrate which straddles their respective gate layers,
    wherein the first MOS device and the second MOS device constitute a first capacitive element through the connection of a gate layer and an N-type diffusion layer of the first MOS device to an N-type diffusion layer and a gate layer of the second MOS device, respectively.

2. The semiconductor device according to claim 1, wherein the first MOS device and the second MOS device are substantially equivalent in size.

3. The semiconductor device according to claim 1, further comprising a second capacitive element connected in parallel to the first capacitive element, the second capacitive element constituted by connecting a gate layer and a diffusion layer of a first one of a pair of MOS transistors to a diffusion layer and a gate layer of a second one of the pair of MOS transistors, respectively.

4. The semiconductor device according to claim 3, wherein the pair of MOS transistors are substantially equivalent in conduction type and size.

5. The semiconductor device according to claim 3, wherein in the second capacitive element the pair of MOS transistors are structured such that a region of immediate-below-gate-layer is provided for each of the pair of MOS transistors, the immediate-below-gate-layer of each of the pair of MOS transistors connected to the diffusion layer of the other one of the pair of MOS transistors.

6. The semiconductor device according to claim 3, wherein the second capacitive element is characterized by:
    the regions of immediate-below-gate-layer of both of the pair of MOS transistors are biased to a predetermined voltage level; and
    a capacity value of each of the pair of MOS transistors when a voltage between the diffusion layer and the gate layer is set to 0V is lower than 50% of a maximum capacity value.

7. The semiconductor device according to claim 1, wherein the impurities added to the P-type substrate are impurities for a well layer, the well layer constituting the region of immediate-below-gate-layer of the second MOS device.

8. The semiconductor device according to claim 1, wherein the impurities added to the P-type substrate are impurities which isolate the second MOS device from other MOS devices at the device level.

9. The semiconductor device according to claim 1, wherein the impurities added to the P-type substrate are impurities which are added to the region of immediate-below-gate-layer for controlling a threshold voltage of the second MOS device.

10. A computing device comprising:
    a processor;
    an input component;
    an output component;
    a memory comprising:
    a volatile memory; and
    a non-volatile memory comprising:
    a first MOS device comprising impurities that are formed on a surface of a P-type substrate provided as a base, the P-type substrate including includes a region located beneath the gate of the first MOS device that is free of added impurities wherein the first MOS device has a characteristic with depletion mode features;
    a second MOS device comprising impurities that are formed on a surface of the P-type substrate provided as a base wherein the impurities that are formed on the surface of the P-type substrate form a well layer that is formed immediately below the gate layer of the second MOS device, wherein the P-type substrate includes a region located beneath the gate of the second MOS device that is free of impurities in addition to the impurities formed on the surface of the p-type substrate wherein the second MOS device has a characteristic with depletion mode features; and a third MOS device that is isolated from the first MOS device and the second MOS device by a channel stop region comprising a well layer that is formed below an STI region that has a top surface that is coplanar with said substrate and that extends into second and third well layers wherein the entire channel stop region lies between the second MOS device and the third MOS device, wherein the first MOS device and the second MOS device, each have an N-type diffusion region on the surface of the P-type substrate which straddles their respective gate layers, wherein the first MOS device and the second MOS device constitute a first capacitive element through the connection of a gate layer and an N-type diffusion layer of the first MOS device to an N-type diffusion layer and a gate layer of the second MOS device, respectively.

11. The computing device according to claim 10, wherein the first MOS device and the second MOS device are substantially equivalent in size.

12. The computing device according to claim 10, further comprising a second capacitive element connected in parallel to the first capacitive element, the second capacitive element constituted by connecting a gate layer and a diffusion layer of a first one of a pair of MOS transistors to a diffusion layer and a gate layer of a second one of the pair of MOS transistors, respectively.

13. The computing device according to claim 12, wherein the pair of MOS transistors are substantially equivalent in conduction type and size.

14. The computing device according to claim 12, wherein in the second capacitive element the pair of MOS transistors are structured such that an region of immediate-below-gate-layer is provided for each of the pair of MOS transistors, the immediate-below-gate-layer of each of the pair of MOS transistors connected to the diffusion layer of the other one of the pair of MOS transistors.

15. The computing device according to claim 12, wherein the second capacitive element is characterized by:
   the regions of immediate-below-gate-layer of both of the pair of MOS transistors are biased to a predetermined voltage level; and
   a capacity value of each of the pair of MOS transistors when a voltage between the diffusion layer and the gate layer is set to 0V is lower than 50% of a maximum capacity value.

16. The computing device according to claim 10, wherein the impurities added to the P-type substrate are impurities for a well layer, the well layer constituting the region of immediate-below-gate-layer of the second MOS device.

17. The computing device according to claim 10, wherein the impurities added to the P-type substrate are impurities which isolate the second MOS device from other MOS devices at the device level.

18. The computing device according to claim 10, wherein the impurities added to the P-type substrate are impurities which are added to the region of immediate-below-gate-layer for controlling a threshold voltage of the second MOS device.

19. A wireless communications device, said wireless communications device comprising:
   a non-volatile memory comprising:
   a first MOS device comprising impurities that are formed on a surface of a P-type substrate provided as a base, the P-type substrate including a region located beneath the gate of the first MOS device that is free of added impurities wherein the first MOS device has a characteristic with depletion mode features;

a second MOS device comprising impurities that are formed on a surface of the P-type substrate provided as a base wherein the impurities that are formed on the surface of the P-type substrate form a well layer that is formed immediately below the gate layer of the second MOS device, wherein the P-type substrate includes a region located beneath the gate of the second MOS device that is free of impurities in addition to the impurities formed on the surface of the p-type substrate wherein the second MOS device has a characteristic with depletion mode features; and a third MOS device that is isolated from the first MOS device and the second MOS device by a channel stop region comprising a well layer that is formed below an STI region that has a top surface that is coplanar with said substrate and that extends into second and third well layers wherein the entire channel stop region lies between the second MOS device and the third MOS device, wherein the first MOS device and the second MOS device, each have an N-type diffusion region on the surface of the P-type substrate which straddles their respective gate layers, wherein the first MOS device and the second MOS device constitute a first capacitive element through the connection of a gate layer and an N-type diffusion layer of the first MOS device to an N-type diffusion layer and a gate layer of the second MOS device, respectively, a processor;
a communications component;
a transmitter;
a receiver; and
an antenna connected to the transmitter circuit and the receiver circuit.

20. The device according to claim 19, wherein the first MOS device and the second MOS device are substantially equivalent in size.

21. The device according to claim 19, further comprising a second capacitive element connected in parallel to the first capacitive element, the second capacitive element constituted by connecting a gate layer and a diffusion layer of a first one of a pair of MOS transistors to a diffusion layer and a gate layer of a second one of the pair of MOS transistors, respectively.

22. The device according to claim 19, wherein the second capacitive element is characterized by:
   the regions of immediate-below-gate-layer of both of the pair of MOS transistors are biased to a predetermined voltage level; and
   a capacity value of each of the pair of MOS transistors when a voltage between the diffusion layer and the gate layer is set to 0V is lower than 50% of a maximum capacity value.

23. A media content player comprising:
   a non-volatile memory that stores one or more media content items, said non-volatile memory comprising:
   a first MOS device comprising impurities that are formed on a surface of a P-type substrate provided as a base, the P-type substrate including a region located beneath the gate of the first MOS device that is free of added impurities wherein the first MOS device has a characteristic with depletion mode features;
   a second MOS device comprising impurities that are formed on a surface of the P-type substrate provided as a base wherein the impurities that are formed on the surface of the P-type substrate form a well layer that is formed immediately below the gate layer of the second MOS device, wherein the P-type substrate includes a region located beneath the gate of the second MOS device that is free of impurities in addition to the impurities formed on the surface of the p-type substrate wherein the second MOS device has a characteristic with depletion mode features; and a third MOS device that is isolated from the first MOS device and the second MOS device by a channel stop region comprising a well layer that is formed below an STI region that has a top surface that is coplanar with said substrate and that extends into second and third well layers wherein the entire channel stop region lies between the second MOS device and the third MOS device, wherein the first MOS device and the second MOS device, each have an N-type diffusion region on the surface of the P-type substrate which straddles their respective gate layers, wherein the first MOS device and the second MOS device constitute a first capacitive element through the connection of a gate layer and an N-type diffusion layer of the first MOS device to an N-type diffusion layer and a gate layer of the second MOS device, respectively, a user input that enables the selection of one or more of said media item;

a processor coupled to said user input and said storage component that causes the playback of a selected media item, and one or more playback devices for conveying the playback of said media item.

24. The media content player according to claim 23, further comprising a second capacitive element connected in parallel to the first capacitive element, the second capacitive element constituted by connecting a gate layer and a diffusion layer of a first one of a pair of MOS transistors to a diffusion layer and a gate layer of a second one of the pair of MOS transistors, respectively.

25. The media content player according to claim 24, wherein the second capacitive element is characterized by:
   the regions of immediate-below-gate-layer of both of the pair of MOS transistors are biased to a predetermined voltage level; and
   a capacity value of each of the pair of MOS transistors when a voltage between the diffusion layer and the gate layer is set to 0V is lower than 50% of a maximum capacity value.

26. An image acquisition system, comprising:
an image acquisition component for acquiring image data;
a storage component for storing image data, said storage component comprising non-volatile memory comprising:

a first MOS device comprising impurities that are formed on a surface of a P-type substrate provided as a base, the P-type substrate including a region located beneath the gate of the first MOS device that is free of added impurities wherein the first MOS device has a characteristic with depletion mode features;

a second MOS device comprising impurities that are formed on a surface of the P-type substrate provided as a base wherein the impurities that are formed on the surface of the P-type substrate form a well layer that is formed immediately below the gate layer of the second MOS device, wherein the P-type substrate includes a region located beneath the gate of the second MOS device that is free of impurities in addition to the impurities formed on the surface of the p-type substrate wherein the second MOS device has a characteristic with depletion mode features; and a third MOS device that is isolated from the first MOS device and the second MOS device by a channel stop region comprising a well layer that is formed below an STI region that has a top surface that is coplanar with said substrate and that extends into second and third well layers wherein the entire channel stop region lies between the second MOS device and the third MOS device, wherein the first MOS device and the second MOS device, each have an N-type diffusion region on the surface of the P-type substrate which straddles their respective gate layers, wherein the first MOS device and the second MOS device constitute a first capacitive element through the connection of a gate layer and an N-type diffusion layer of the first MOS device to an N-type diffusion layer and a gate layer of the second MOS device, respectively, and a display unit for displaying said image data stored in said storage component.

27. The image acquisition system according to claim 26, further comprising a second capacitive element connected in parallel to the first capacitive element, the second capacitive element constituted by connecting a gate layer and a diffusion layer of a first one of a pair of MOS transistors to a diffusion layer and a gate layer of a second one of the pair of MOS transistors, respectively.

28. The image acquisition system according to claim 27, wherein the second capacitive element is characterized by:
   the regions of immediate-below-gate-layer of both of the pair of MOS transistors are biased to a predetermined voltage level; and
   a capacity value of each of the pair of MOS transistors when a voltage between the diffusion layer and the gate layer is set to 0V is lower than 50% of a maximum capacity value.

* * * * *